US010957703B2

(12) United States Patent
Singh et al.

(10) Patent No.: US 10,957,703 B2
(45) Date of Patent: Mar. 23, 2021

(54) METHOD OF REDUCING CHARGE LOSS IN NON-VOLATILE MEMORIES

(71) Applicant: Cypress Semiconductor Corporation, San Jose, CA (US)

(72) Inventors: Pawan Kishore Singh, Santa Clara, CA (US); Shivananda Shetty, San Jose, CA (US); James Pak, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 38 days.

(21) Appl. No.: 16/056,183

(22) Filed: Aug. 6, 2018

(65) Prior Publication Data

US 2019/0074286 A1 Mar. 7, 2019

Related U.S. Application Data

(63) Continuation of application No. 15/614,271, filed on Jun. 5, 2017, now Pat. No. 10,068,912.

(51) Int. Cl.
*H01L 27/11568* (2017.01)
*H01L 21/28* (2006.01)
*H01L 29/06* (2006.01)

(52) U.S. Cl.
CPC .... *H01L 27/11568* (2013.01); *H01L 29/0649* (2013.01); *H01L 29/40117* (2019.08)

(58) Field of Classification Search
CPC ........ B29D 2030/0674; B29D 30/0606; H01L 27/11568; H01L 29/0649; H01L 29/40117;

(Continued)

(56) References Cited

U.S. PATENT DOCUMENTS 4,105,805 A 8/1978 Glendinning et al.
5,521,115 A 5/1996 Park et al.

(Continued)

FOREIGN PATENT DOCUMENTS

KR 1020090068016 A 6/2009
TW 1508064 B 11/2015

(Continued)

OTHER PUBLICATIONS

U.S. Appl. No. 15/614,271: "Method of Reducing Charge Loss in Non-Volatile Memories" Pawan Kishore Singh et al., filed Jun. 5, 2017; 55 pages.

(Continued)

*Primary Examiner* — Duy T Nguyen

(57) ABSTRACT

An example embodiment comprises a method for fabrication of a non-volatile memory (NVM) device. An isolation structure is formed in a substrate between first and second locations for first and second NVM cells. A common charge trapping layer is formed as a continuous structure over the substrate, where a first portion of the charge trapping layer is disposed directly over the isolation structure and second portions of the charge trapping layer are disposed directly over the first and second substrate locations. Nitrogen doping of the first portion of the charge trapping layer is performed, where after the nitrogen doping is performed the first portion of the charge trapping layer includes a higher nitrogen concentration than the second portions. The first and second NVM cells are then formed over the first and second substrate locations, where the first and second NVM cells include the second portions of the charge trapping layer.

10 Claims, 14 Drawing Sheets

(58) Field of Classification Search
CPC ......... H01L 27/11521; H01L 21/28282; H01L 29/792; H01L 21/28202; H01L 21/265; H01L 23/53295; H01L 29/518
See application file for complete search history.

(56) References Cited

U.S. PATENT DOCUMENTS 5,940,735 A 8/1999 Mehta et al.
6,602,754 B1 8/2003 Kluth et al.
6,713,388 B2 3/2004 Tseng et al.
8,198,671 B2 6/2012 Olsen et al.
8,604,537 B2 12/2013 Lee et al.
9,023,707 B1 * 5/2015 Ramkumar ....... H01L 27/11568 438/197
2004/0041206 A1 * 3/2004 Bhattacharyya .... H01L 29/7841 257/326
2004/0132292 A1 * 7/2004 Mariani .............. H01L 21/0337 438/689
2006/0284236 A1 * 12/2006 Bhattacharyya ............................ H01L 29/40114 257/314
2007/0026621 A1 * 2/2007 Cho .................. H01L 27/10852 438/314
2007/0076477 A1 4/2007 Hwang et al.
2008/0199996 A1 8/2008 Muralidhar et al.
2010/0059808 A1 3/2010 Zheng et al.
2010/0123181 A1 * 5/2010 Park .................. H01L 27/11568 257/324
2010/0213535 A1 8/2010 Kathawala et al.
2010/0213536 A1 * 8/2010 Nakanishi ......... H01L 27/11565 257/324
2011/0075486 A1 3/2011 Liao et al.
2013/0240976 A1 9/2013 Tanaka
2014/0312408 A1 10/2014 Fang
2015/0092485 A1 4/2015 Tsaoussis
2016/0111292 A1 4/2016 Ramsbey et al.
2016/0141180 A1 5/2016 Jenne et al.

FOREIGN PATENT DOCUMENTS

WO 2005027210 A1 3/2005
WO 2014008166 A1 1/2014
WO 2014008515 A1 1/2014
WO 2014176246 A1 10/2014

OTHER PUBLICATIONS

Choi, Sangmoo, "Memory Characteristics of Silicon Nitride with Silicon Nanocrystals as a Charge Trapping Layer of Nonvolatile Memory Devices," Applied Physics Letters, vol. 86, Jun. 2005, 4 pages.
International Search Report for International Application No. PCT/US18/18995 dated May 4, 2018; 2 pages.
USPTO Non Final Rejection for U.S. Appl. No. 15/614,271 dated Feb. 13, 2018; 12 pages.
USPTO Notice of Allowance for U.S. Appl. No. 15/614,271 dated May 10, 2018; 8 pages.
USPTO Requirement for Restriction for U.S. Appl. No. 15/614,271 dated Nov. 3, 2017; 5 pages.
Written Opinion of the International Searching Authority for International Application No. PCT/US18/18995 dated May 4, 2018; 6 pages.
Taiwanese Office Action for Application No. 107104998 dated Dec. 4, 2020; 11 pages.

* cited by examiner

METHOD OF REDUCING CHARGE LOSS IN NON-VOLATILE MEMORIES

This Application is a Continuation of U.S. patent application Ser. No. 15/614,271, filed on Jun. 5, 2017 and issued as U.S. Pat. No. 10,068,912 on Sep. 4, 2018, which is hereby incorporated by reference in its entirety.

TECHNICAL FIELD

Background

Memory that retains its data even when operation power is not available is classified as non-volatile memory. Examples of non-volatile memory (NVM) are nvSRAM, ferroelectric RAM (F-RAM), programmable-read-only memory (PROM), erasable-programmable-read-only memory (EPROM), electrically-erasable-programmable-read-only-memory (EEPROM), and charge trapping and/or floating gate flash memories. Some memory arrays utilize transistors and gate structures which may include a charge trapping layer. The charge trapping layer may be programmed to store data based on voltages applied to or received by the memory array. This class of memory may be used in applications in which critical data must be stored after power is removed, or when power is interrupted during operation. The fabrication of two-dimensional or planar flash memory devices is down to 10 nm lithography, and the reduction in scale has started to create issues as each NV memory element is getting smaller and physically closer to one another. In these NV memory elements, their charge trapping gates hold much fewer electrical charges due to the smaller scale. As a result, any small imperfection in the fabrication process may cause logic/memory states of the NV memory elements to become difficult to differentiate, which may result in a false reading of logic states. Moreover, control electrodes are getting so small and closely spaced that their effects, such as in biasing gates, may spread over more than one memory cells or strings, which may lead to unreliable reading and writing of data.

BRIEF DESCRIPTION OF THE DRAWINGS

The present disclosure is illustrated by way of example, and not by way of limitation, in the FIGS. of the accompanying drawings.

DETAILED DESCRIPTION

Figure 1A:
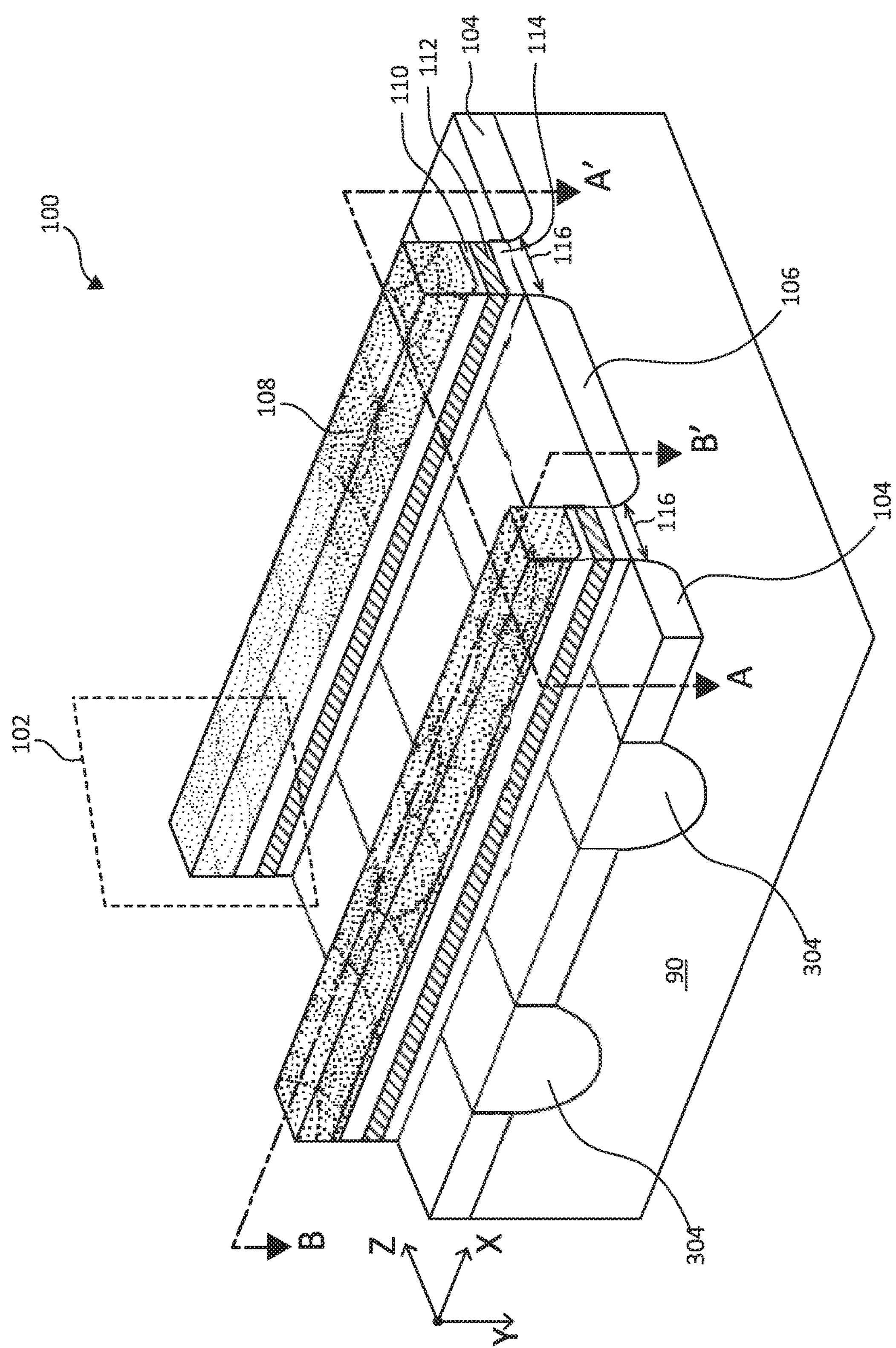
FIG. 1A is a schematic diagram illustrating a portion of an NVM array (one transistor memory cell) in accordance with one embodiment of the subject matter.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Embodiments of a memory cells including non-volatile memory (NVM) transistors and split gate memory transistors and methods of fabricating the same are described herein with reference to figures. However, particular embodiments may be practiced without one or more of these specific details, or in combination with other known methods, materials, and apparatuses in related art. In the following description, numerous specific details are set forth, such as specific materials, dimensions, concentrations, and processes parameters etc. to provide a thorough understanding of the subject matter. In other instances, well-known semiconductor design and fabrication techniques have not been described in particular detail to avoid unnecessarily obscuring the subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting wafer without consideration of the absolute orientation of the wafer or substrate.

SUMMARY OF SUBJECT MATTER

According to one embodiment, a memory apparatus may have first and second non-volatile memory (NVM) cells disposed side by side overlying a substrate and an isolation structure disposed between the first and second NVM cells in the substrate. The first and second NVM cells may share a common charge trapping layer that includes a continuous structure in which a first portion of the common charge trapping layer that is disposed directly above the isolation structure may have a higher oxygen concentration than second portions of the common charge trapping layer that are disposed within the first and second NVM cells.

In one embodiment, the first portion of the common charge trapping layer disposed directly above the isolation structure may also include a higher nitrogen concentration than the second portions of the common charge trapping layer disposed within the first and second NVM cells.

In one embodiment, the common charge trapping layer includes at least one of silicon nitride and silicon oxynitride. The first portion of the common charge trapping layer may include at least one of silicon dioxide and oxygen-rich silicon oxynitride. And in some embodiments, the first portion of the common charge trapping layer may include at least one of nitrogen-rich silicon nitride and nitrogen-rich silicon oxynitride.

In one embodiment, the isolation structure may be shallow trench isolation (STI) extending in a direction that is perpendicular to an extension direction of the common charge trapping layer, and parallel to channel lengths of the first and second NVM cells.

The first portion of the common charge trapping layer may have a first width and the isolation structure a second width. In one embodiment, the second width is greater than the first width in which the first portion is substantially disposed and aligned within a vertical projection of the second width of the isolation structure.

In one embodiment, the NVM cells include silicon-oxide-nitride-oxide-silicon (SONOS) type transistors and/or split gate memory cells.

In one embodiment, the first portion of the common charge trapping layer may have a first electrical resistivity value and each of the second portions of the common charge trapping layer may have a second electrical resistivity value, in which the first electrical resistivity value is greater than the second electrical resistivity value.

In some embodiments, the first and second NVM cells may share a common memory gate electrode layer in the same word line.

According to another embodiment, an NVM array may have a plurality of memory cells arranged in rows and columns, in which each memory cell includes a memory transistor and memory transistors of the same row may share a common charge trapping layer that may be an integral continuous structure. The NVM array may also have a plurality of shallow trench isolations (STIs) extending in a direction perpendicular to the rows of the NVM array, in which each STI separates two neighboring memory transistors of the same row. In one embodiment, a portion of the common charge trapping layer disposed directly above the each STI includes a higher oxygen and nitrogen concentration than portions of the common charge trapping layers disposed within the two neighboring memory transistors.

In one embodiment, the plurality of memory cells of the NVM array includes split gate memory cells, one transistor, two transistor memory cells, or a combination thereof.

In one embodiment, the plurality of STIs extends in the direction parallel to channel lengths of the plurality of memory cells.

In one embodiment, the portion of the common charge trapping layer disposed directly above the each STI includes greater electrical resistivity than the portions of the common charge trapping layers disposed within the two neighboring memory transistors.

According to another embodiment of the present application, a memory apparatus may have first and second split gate memory cells disposed side by side over a substrate and a shallow trench isolation (STI) disposed between the first and second split gate cells in the substrate. In one embodiment, the first and second split gate cells may share a common charge trapping layer, in which a first portion of the common charge trapping layer is disposed directly above the STI, and second portions of the common charge trapping layer are disposed directly above channels of the first and second split gate memory cells. The first and second portions may form integrally a continuous structure of the common charge trapping layer, and the first portion may have a higher nitrogen concentration than the second portions of the common charge trapping layer.

In one embodiment, the first portion of the common charge trapping layer may have a first width and the STI may have a second width. The second width may be greater than the first width, and the first portion may be substantially disposed and aligned within a vertical projection of the second width of the STI.

In one embodiment, the first portion of the common charge trapping layer that is directly above the STI includes first stoichiometry of, silicon in an approximate concentration range of 43-50%, oxygen in an approximate concentration of 0%, and nitrogen in an approximate concentration range of 50-57%. The second portions of the common charge trapping layer that are disposed within the first and second split gate cells may have second stoichiometry of silicon in an approximate concentration range of 50-55%, oxygen in an approximate concentration of 0%, and nitrogen in an approximate concentration range of 45-50%.

In one embodiment, the first portion may have a higher electrical resistivity than the second portions of the common charge trapping layer.

Figure 7:
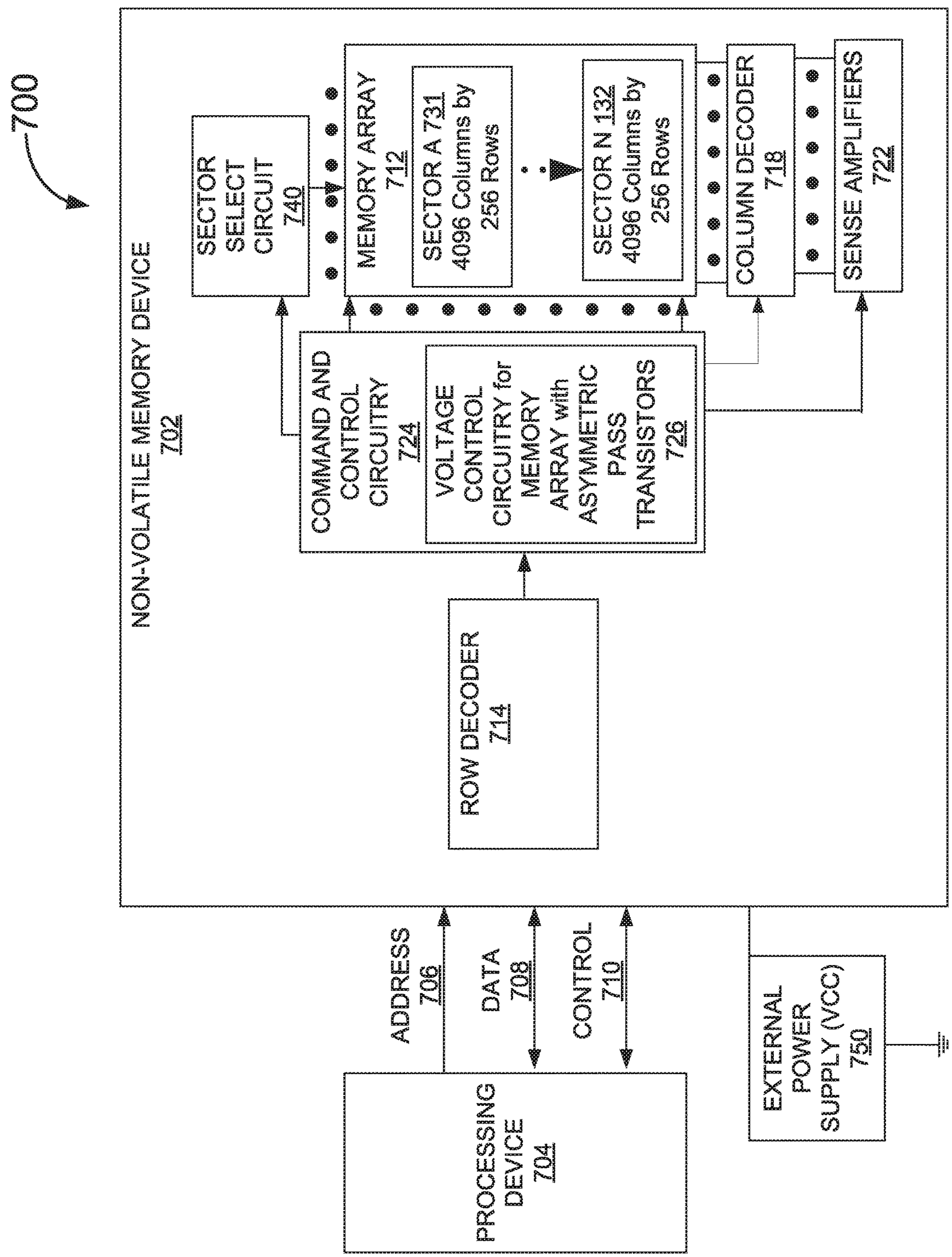
FIG. 7 is a schematic diagram illustrating an NVM system in accordance with one embodiment of the subject matter.

Computers and other processing devices may store information or programs which have been developed or updated in NVM, such as flash memory including NAND and NOR, EEPROM, F-RAM. In the event of a power down, power outage or a mistake, data can be retrieved. FIG. 7 is a block diagram illustrating an NVM system 700, according to an embodiment. NVM system 700 may include a processing device 704 coupled to NVM device 702 via address bus 706, data bus 708, and control bus 710. It will be appreciated by those skilled in the art that NVM system 700 has been simplified for the purpose of illustration, and not intended to be a complete description. In particular, details of the processing device 704, row decoder 714, column decoder 718, and sense amplifiers 722, are not described in detail herein. It should be appreciated that NVM system 700 may include all, some, or more components than the embodiment in FIG. 7.

External power supply 750, also referred to as power supply, is coupled to NVM device 702. External power supply 750 may be a power supply external to NVM device 702 and may be used by NVM device 702 to generate voltage signals, such as high voltage (HV) signals that are above the highest voltage of the external power supply 750 or below a lowest voltage of the external power supply 750 (e.g., ground voltage).

Processing device 704 may reside on a common carrier substrate such as, for example, an integrated circuit ("IC") die substrate, a multi-chip module substrate, or the like. Alternatively, the components of processing device 704 may be one or more separate integrated circuits and/or discrete components. In one exemplary embodiment, processing device 704 may be the Programmable System on a Chip (PSoC®) processing device, developed by Cypress Semiconductor Corporation, San Jose, Calif. Alternatively, processing device 704 may be one or more other processing devices known by those of ordinary skill in the art, such as a microprocessor or central processing unit ("CPU"), a controller, special-purpose processor, digital signal processor ("DSP"), an application specific integrated circuit ("ASIC"), a field programmable gate array ("FPGA"), or the like.

NVM device 702 includes memory array 712, such as an NVM array, organized as rows and columns of non-volatile memory cells (not shown in FIG. 7) as described below. Memory array 712 is coupled to row decoder 714 either directly or through command and control circuitry 724 via multiple select lines and read lines (at least one select line and one read line for each row of the memory array). Memory array 712 is further coupled to column decoder 718 via multiple bit lines (one each for each column of the memory array). It will be appreciated that common source lines (CSLs) may be implemented as part of the multiple select lines and read lines and/or the multiple bit lines. Memory array 712 may be coupled to multiple sense amplifiers 722, via column decoder 718, to read multi-bit words therefrom. NVM device 702 further includes command and control circuitry 724 to receive signals from processing device 704 and sends signals to row decoder 714, control column decoder 718, sense amplifiers 722, control sector select circuit 740, and control voltage signals applied to memory array 712. Command and control circuitry 724 includes voltage control circuitry 726 for memory array 712 with pass transistors or select gates to generate and control the voltage signals for operation of NVM device 702. In one embodiment, the voltage signals may be routed through voltage control circuitry 726 to column decoder 718, sense amplifiers 722, and/or sector selector circuit 740. Voltage control circuitry 726 operates to apply appropriate voltages, including high voltage (HV) signals and low voltage (LV) signals, to the memory cells during pre-program, erase, program, read operations, and/or other operations. In one exemplary embodiment, NVM device 702 may be the eCT® memory device, developed by Cypress Semiconductor Corporation, San Jose, Calif.

Command and control circuitry 724 may be configured to select a first row of memory array 712 for a program operation by applying a voltage to a first select line in the first row and to deselect a second row of the memory array by applying another voltage to a second select line in the second row. Command and control circuitry 724 may be further configured to control column decoder 718 to select a memory cell in the first row for programming by applying a voltage to a first bit line in a first column, and to inhibit an unselected memory cell in the first row from programming by applying another voltage to a second bit line in a second column. Command and control circuitry 724, in particular voltage control circuitry 726, may be further configured to apply a voltage to one or more common source lines that may be coupled to memory cells included in memory cell array 712 as described below.

In one embodiment, as discussed in greater detail below, NVM device 702 may include various memory cells (not shown) configured to store data values. The memory cells may be implemented with a nitride-containing charge trapping layer and a common source line to reduce the overall footprint of each memory cell. Each memory cell may also be compatible with Fowler-Nordheim programming techniques.

Memory array 712 may include one or more NVM sectors, such as sector A 731 though sector N 732. Each sector may have any number of rows and columns of NVM cells, for example 4096 columns and 256 rows. Rows may include multiple NVM cells arranged horizontally. Columns may include multiple NVM cells arranged vertically. Memory array 712 may use a global bit line (GBL) shared by all the sectors of memory array 712. Each column of memory array 712 may have a GBL. For example, a particular GBL for column 0 shared by all of the sectors (e.g., sector A 731 through sector N 732) will be coupled to each row of memory array 712 in column 0 of all the sectors. The GBL is configured to provide voltage signals to the sectors of memory array 712 during program operations and erase operation, but not during read operations.

Memory array 712 may use sector select circuit 740 to couple the GBL to an associated bit line (BL) of a column of a particular sector. Each column in a sector may have an associated BL particular to that sector that is not shared by other sectors. Each column in a sector may have a sector select circuit 740 to selectively couple the GBL to the associated BL. For example, a sector select circuit 740 for column 0 of sector A 731 may be used as a switch to couple the voltage signal on GBL of column 0 of memory array 712 to the BL for column 0 of sector A 731 during erase operations and program operations.

Memory array 712 may also use sector select circuit 740 to couple a column of NVM cells in a sector to sense amplifiers 722 during a read operation. For example, a sector select circuit 740 for column 0 of sector A 731 may be used as a switch to couple the NVM cells of column 0 of sector A to sense amplifiers 722 during a read operation.

In various embodiments, memory array 712 may contain one transistor (1T) memory cells (best shown in FIG. 2A), 2T memory cells (FIG. 2C), split gate memory cells (FIG. 2B), a combination thereof, or other types of NVM cells. It will be the understanding that memory array configuration details and operation details discussed in later sections are applicable to at least the 1T and 2T memory cell array, split gate memory cell array, and arrays having other combinations of memory cells.

FIG. 1A illustrates a portion of 1T memory array 100 including multiple 1T memory cells 102 arranged in rows and columns. As best shown in FIG. 1A, direction z may indicate a direction along the columns of the 1T memory array, and direction x may indicate the rows. In one embodiment, each 1T memory cell 102 may include tunnel dielectric layer 114, charge trapping layer 112, blocking dielectric layer 110, and memory gate electrode layer 108. As best shown in FIG. 1A, tunnel dielectric layer 114, charge trapping layer 112, blocking dielectric layer 110, and memory gate electrode layer 108 are continuous layers that may span across multiple 1T memory cells 102 in direction x. In one embodiment, memory gate electrode layer 108 electrically connects multiple 1T memory cells 102 in the same row (direction x) may also be referred to as or a part of word line 108 for the same row of 1T memory cells 102. In some alternative embodiments, at least one of tunnel dielectric layer 114, charge trapping layer 112, blocking dielectric layer 110, and memory gate electrode layer 108 may not be a continuous layer, and each layer segment may be contained discretely within each or multiple 1T memory cells 102 of the same row. Source/drain regions 104 and 106 may be formed substantially besides each 1T memory cell 102 in substrate 90. In one embodiment, each 1T memory cell 102 may have its own source/drain regions 104 and 106. In one particular embodiment, as illustrated in FIG. 1A, each 1T memory cell 102 has its drain region 104, and two adjacent 1T memory cells 102 of the same column may share one source region 106. It will be the understanding that other configurations of source and drain regions may be included in other embodiments. In one embodiment, source/drain regions 104 and 106 may be formed by performing source and drain implants using source/drain patterned mask, and may be followed by a silicide process. The implantation and silicide process may be any commonly employed in the art, which may include a pre-clean etch, cobalt or nickel metal deposition, anneal and wet strip. In one embodiment, channel 116 is disposed in substrate 90 between source/drain regions 104 and 106.

As illustrated in FIG. 1A, multiple isolation structures, such as shallow trench isolations (STIs) 304 are formed in substrate 90. Each STI 304 may have its width oriented in direction x, length in direction z, and depth in direction y. In one embodiment, STIs 304 are formed to isolate each 1T memory cell 102 in the same row (direction x), and each STI 304 may extend to span across multiple rows (direction z).

It should be appreciated that terms "rows" and "columns" of a memory array are used for purposes of illustration, rather than limitation. In one embodiment, rows are arranged horizontally and columns are arranged vertically. In another embodiment, the terms of rows and columns of 1T memory array 100 and memory arrays described in later sections may be reversed or used in an opposite sense, or arranged in any orientation.

Figure 2A:
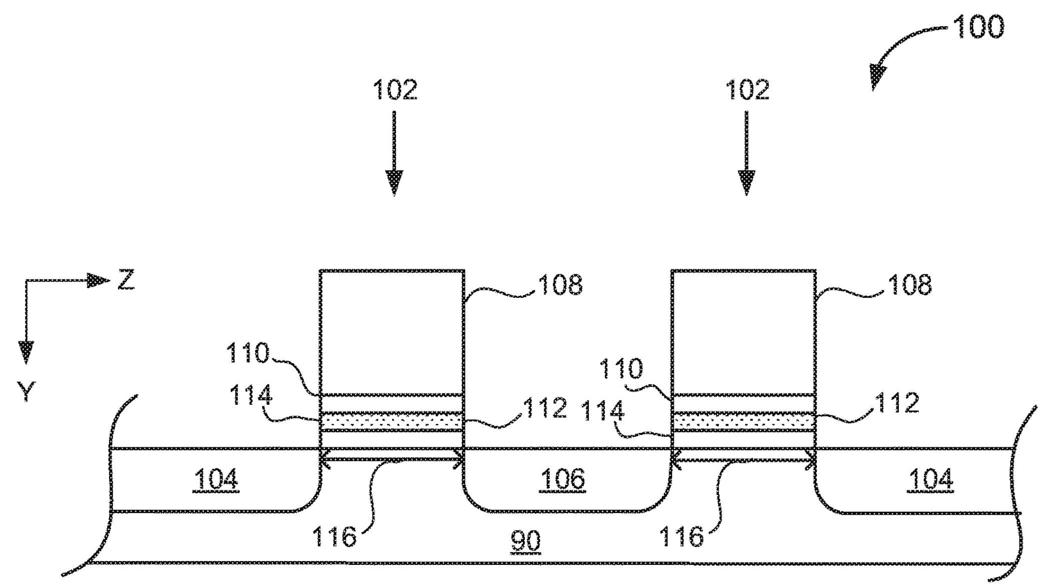
FIG. 2A is a schematic diagram illustrating a cross-sectional view of a portion of the NVM array as illustrated in FIG. 1A.

FIG. 2A illustrates a side cross-sectional view of one embodiment of a portion of 1T memory array 100 along A-A' of FIG. 1A. As best illustrated in FIG. 2A, two adjacent 1T memory cells of the same column (along direction z) are included. It will be the understanding that there may be more than two 1T memory cells 102 in one column of 1T memory array 100.

As best shown in FIG. 2A, in one embodiment, an NVM cell may be a 1T memory cell 102. In 1T memory cell 102, the transistor may be a memory transistor having memory gate (MG) electrode 108 disposed over blocking dielectric layer 110, charge trapping layer 112, and tunnel dielectric layer 114. Source or source region 106 and drain or drain region 104 are disposed besides each 1T memory cell 102. Channel 106 may be disposed between source region 106 and drain region 104, and underneath tunnel dielectric layer 114 in substrate 90. Channel length extends in direction z, connecting source 106 and drain 104 regions. In one embodiment, two adjacent 1T memory cells 102, as shown in FIG. 2A, share one source region 106. In other embodiments, each 1T memory cell 102 may have its own source region (not shown in FIG. 2A). In one embodiment, 1T memory cell 102 may be a memory transistor that stores a bit of binary information, for example by varying the charge stored in charge trapping layer 112.

Figure 1B:
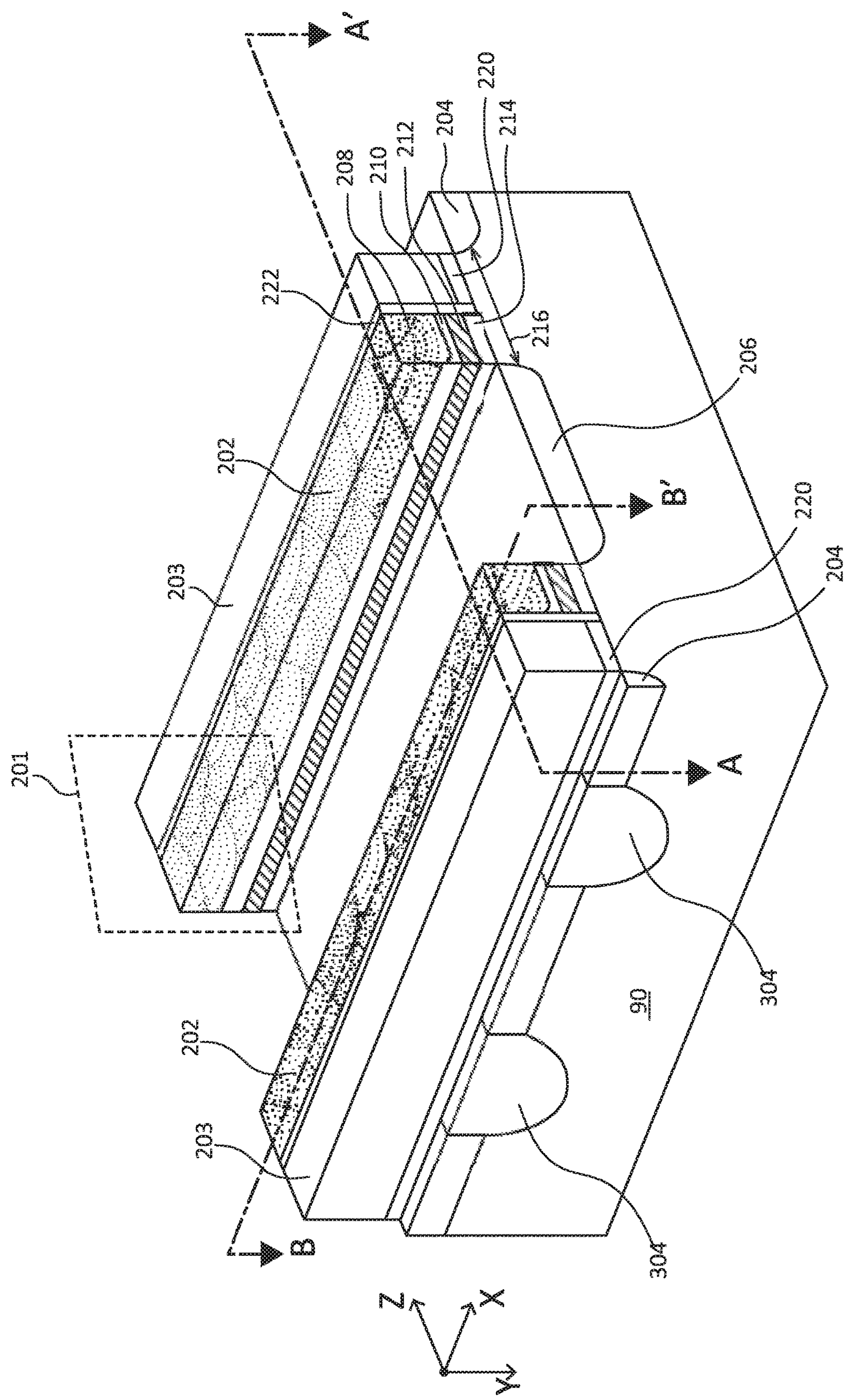
FIG. 1B is a schematic diagram illustrating a portion of an NVM array (split gate memory cell) in accordance with another embodiment of the subject matter.

FIG. 1B illustrates a portion of split gate memory array 200 including multiple split gate memory cells 201 being arranged in rows and columns. In one embodiment, direction z may indicate a direction along the columns of split gate memory array 200, and direction x may indicate the rows. In one embodiment, each split gate memory cell 201 may include memory transistor 202 and select transistor 203. Memory transistor 202 may have a structure resembling 1T memory cell 102, as best shown in FIG. 2A, and may include tunnel dielectric layer 214, charge trapping layer 212, blocking dielectric layer 210, and memory gate electrode layer 208. As best shown in FIG. 1B, tunnel dielectric layer 214, charge trapping layer 212, blocking dielectric layer 210, and memory gate electrode layer 208 are continuous layers that span across multiple split gate memory cells 201 in direction x. In one embodiment, memory gate electrode layer 208 may electrically connect multiple memory transistors 202 of split gate memory cells 201 in the same row (direction x). In one embodiment, memory gate electrode layer 208 that connects multiple memory transistors 202 of the same row may also be referred to as or a part of word line 208. In some alternative embodiments, at least one of tunnel dielectric layer 214, charge trapping layer 212, blocking dielectric layer 210, and memory gate electrode layer 208 may not be a continuous layer, and some layer segments may be contained discretely within each or multiple memory transistors 202 of the same row. In one embodiment, each select transistor 203 may include select gate electrode layer 218 overlying gate dielectric layer 220. In one embodiment, both select gate electrode layer 218 and gate dielectric layer 220 may be a continuous layer spanning across multiple select transistors 203 of the same row (direction x). In other embodiments, either select gate electrode layer 218 or gate dielectric layer 220 may not be a continuous layer. Source/drain regions 204 and 206 may be formed primarily on both sides of each split gate memory cell 201 in substrate 90. In one embodiment, each split gate memory cell 201 may have its own source/drain regions 204 and 206, adjacent to memory transistor 202 and select transistor 203 respectively. In one particular embodiment, as illustrated in FIG. 1A, each split gate memory cell 201 may have its own drain region 204, and two adjacent split gate memory cells 201 of the same column (direction z) may share one source region 206. As best shown in FIG. 1B, source region 206 is disposed across and also shared amongst multiple split gate memory cells 201 in the same two rows (direction x), resembling a common source line of two adjacent rows of split gate memory cells 201. This particular embodiment may also be referred to as common source line (CSL) configuration. It will be the understanding that other configurations of source and drain regions may be included in other embodiments. In one embodiment, source/drain regions 204 and 206 may be formed by performing source and drain implants using S/D patterned mask, and may be followed by a silicide process. The implantation and silicide process may be any commonly employed in the art, which may include a pre-clean etch, cobalt or nickel metal deposition, anneal and wet strip. In one embodiment, channel 216 is disposed in substrate 90 and channel length may extend between source/drain regions 204 and 206 in direction z.

As illustrated in FIG. 1B, multiple isolation structures, such as shallow trench isolations (STIs) are formed in substrate 90. Each STI 304 may have its width oriented in direction x, length in direction z, and depth in direction y. In one embodiment, STIs 304 may be formed to isolate each split gate memory cell 201 in the same row (direction x), and each STI 304 may span across multiple rows (direction z).

Figure 2B:
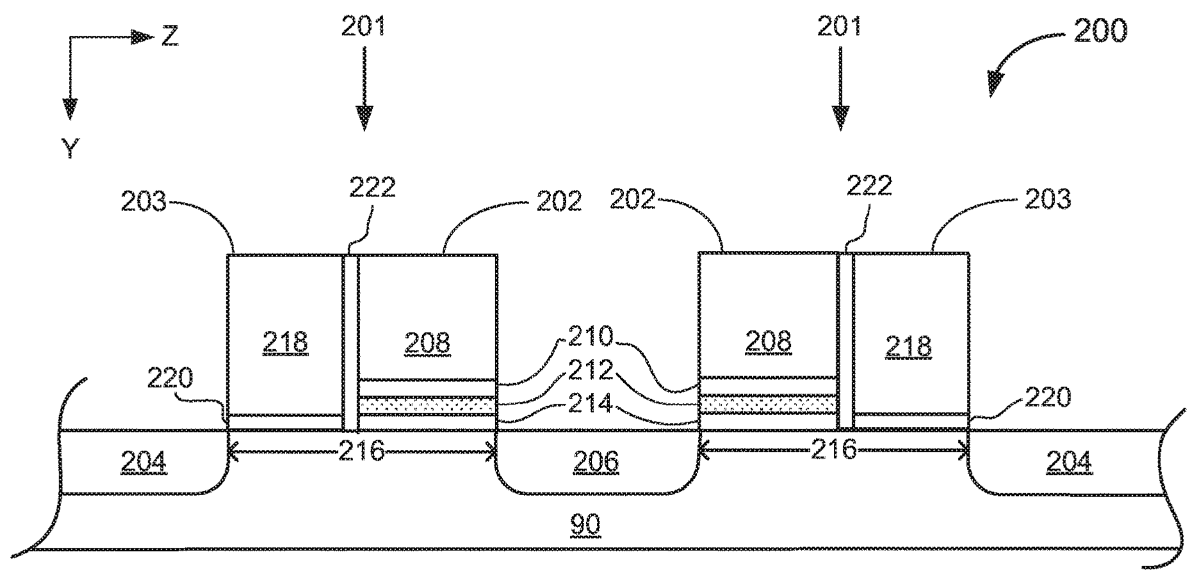
FIG. 2B is a schematic diagram illustrating a cross-sectional view of a portion of the NVM array as illustrated in FIG. 1B.

FIG. 2B illustrates a side cross-sectional view of one embodiment of a portion of split gate memory array 200 along A-A' of FIG. 1B. As best illustrated in FIG. 2B, two adjacent split gate memory cells 201 of the same column (along direction z) are included. It will be the understanding that there may be more than two split gate memory cells 201 in one column of split gate memory array 200.

As best shown in FIG. 2B, in one embodiment, an NVM cell may be split gate memory cell 201, which may also be referred to as a 1.5T memory cell. Each split gate memory cell 201 may also include memory transistor 202 and select transistor 203, separated by inter-gate dielectric 222. In one embodiment, memory transistor 202 may include memory gate electrode 208 disposed over blocking dielectric layer 210, charge trapping layer 212, and tunnel dielectric layer 214. Select gate transistor 203 may include select gate electrode layer 218 disposed overlying gate dielectric layer 220. Source or source region 206 and drain or drain region 204 are disposed besides each split gate memory cell 201. Channel 216 may be disposed between source region 206 and drain region 204, and underneath tunnel dielectric layer 214 of memory transistor 202 and gate dielectric layer 220 of select transistor 203 in substrate 90. In one embodiment, two adjacent split gate memory cells 201 may have a mirrored orientation, as shown in FIG. 2A, and share one source region 206. In other embodiments, each split gate memory cell 201 may have its own source region (not shown in FIG. 2B). In one embodiment, memory transistor 202 of split gate memory cell 201 may store a bit of binary information, for example by varying the charge stored in charge trapping layer 212.

Figure 2C:
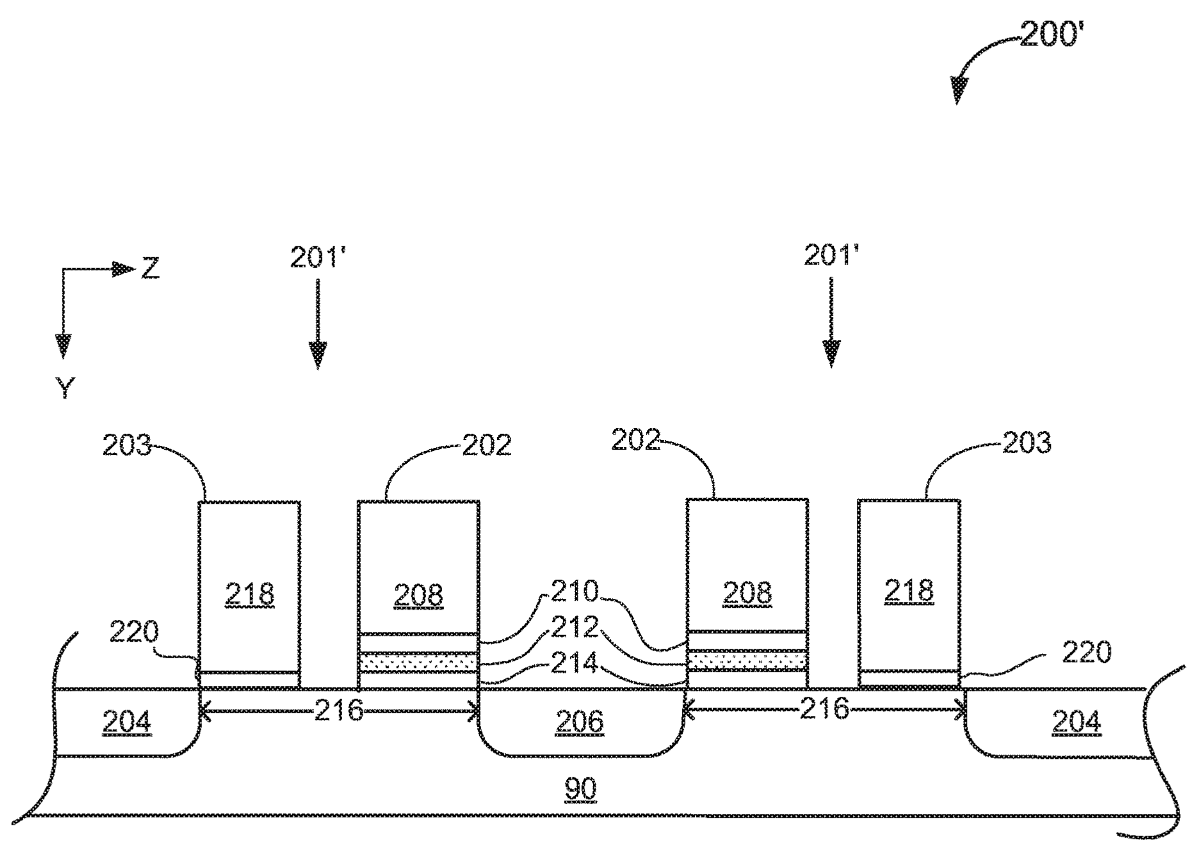
FIG. 2C is a schematic diagram illustrating a cross-sectional view of a portion of a two-transistor memory array.

In some embodiments, memory transistor 202 and select transistor 203 may be physically separated, as best shown in FIG. 2C. The configuration of separated memory transistor 202 and select transistor 203 may also be referred to as a two-transistor (2T) memory cell 200'.

In one embodiment, memory array 100 or 200 may be implemented using charge trapping memory transistors. Charge trapping memory transistors may be implemented to utilize transistors and gate structures that include a charge trapping layer, such as charge trapping layer 112 in 1T memory cell 102 or charge trapping layer 212 in memory transistor 202 of split gate memory cell 201. The charge trapping layer may be primarily an insulator, with certain conductivity, that may be used to trap charges. The charge trapping layer may be programmed to store data based on voltages applied to or received by memory array 100 or 200. In one embodiment, memory array 100 or 200 may include various NVM cells 102 or 201 arranged in rows and columns, and each NVM cell may be capable of storing at least one data value (e.g., bit). Voltages may be applied to each or a group of the NVM cells to pre-program the NVM cell, program the NVM cell (e.g., program operation—store a logic "0" or "1"), erase the NVM cell (e.g., erase operation—store a logic "1" or "0"), or read the NVM cell (e.g., read operation). It should be appreciated that memory array 100 or 200 may be implemented using different types of memory transistors.

In one embodiment, the charge trapping memory transistors may be implemented using different materials. One example of a charge trapping memory transistor is a silicon-oxide-nitride-oxide-silicon (SONOS) type transistor. In a SONOS type transistor, the charge trapping layer of the memory transistor may be a nitride layer, such as a layer of silicon nitride. Moreover, the charge trapping layer may also include other charge trapping materials such as silicon oxy-nitride, aluminum oxide, hafnium oxide, hafnium aluminum oxide, zirconium oxide, hafnium silicate, zirconium silicate, hafnium oxy-nitride, hafnium zirconium oxide, lanthanum oxide, or a high-K layer. The charge trapping layer may be configured to reversibly trap or retain carriers or holes injected from a channel of the memory transistor, and may have one or more electrical characteristics reversibly changed, modified, or altered based on voltages applied to NVM cell. In another embodiment, different types of charge trapping memory transistors may be used. For purposes of illustration, and not limitation, the operation of NVM cells in the disclosure will be described with respect to a SONOS type transistor. It should be appreciated that other types of NVM transistors may be implemented using the disclosure herein.

Voltage signals are used in the operation of non-volatile memory (NVM) devices, such as flash memory or phase-change memory. NVM devices may include one or more NVM cells. An NVM cell, such as 1T memory cell 102 or split gate memory cell 201, may be a unit of memory capable of storing a single data value (e.g., a single bit, such as a logical "0" or logical "1"). In one embodiment, a program operation of NVM cells, such as 1T memory cells 102 or split gate memory cells 201, is achieved by injecting channel hot electrons or holes from the source or drain regions.

Figure 3:
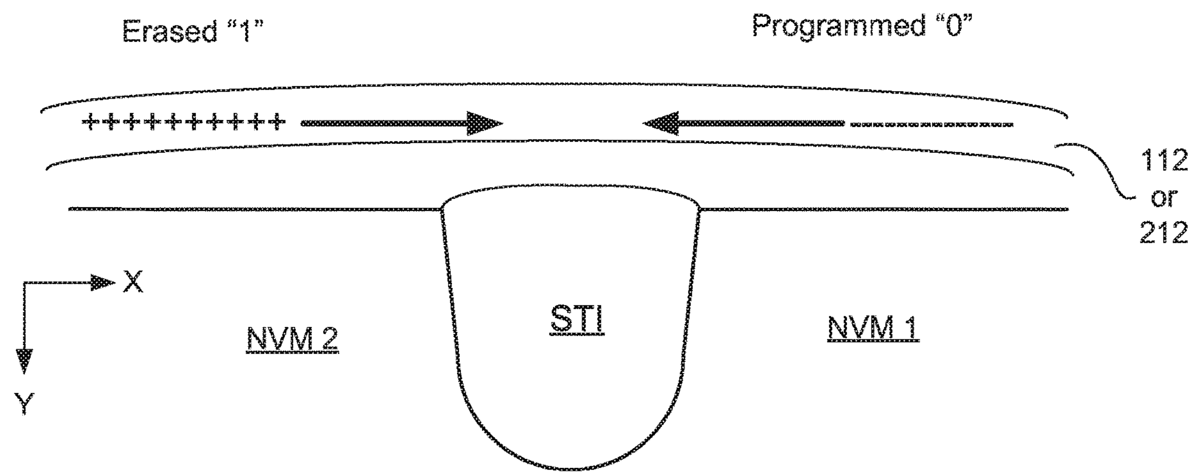
FIG. 3 is a schematic diagram illustrating a shallow trench isolation (STI) of an NVM array in accordance with one embodiment of the subject matter.

FIG. 3 illustrates a representative diagram showing an isolation structure, such as STI 304 in FIGS. 1A and 1B, between NVM cells A and B. As illustrated in FIGS. 1A and 1B, STI 304 is formed in substrate 90, isolating each NVM cell, such as 1T or 2T memory cell 102 or 201' or split gate memory cell 201, of the same row (direction x). In one embodiment, charge trapping layer 112 or 212 may be a continuous layer that extends across multiple NVM cells, such as NVM cells 1 and 2, of the same row. As disclosed earlier, multiple NVM cells of the same row may also share a word line or memory gate electrode layer (not shown in this FIG.). In one embodiment, neighboring NVM cells of the same row, such as NVM cells 1 and 2, may be selected for two different operations. For example, NVM cell 1 may be selected for a program operation and NVM cell 2 may be selected for an erase operation. In one embodiment, NVM cells 1 and 2 may be both n-channel transistors. Therefore, negative charges (electrons) may be trapped in charge trapping layer 112 or 212 of NVM cell 1 due to the programming, whereas positive charges (holes) may be trapped in charge trapping layer 112 or 212 of NVM cell 2 due to the erasing. In one embodiment, charge trapping layer 112 or 212 may be composed of mainly dielectric materials. In order to trap charges, charge trapping layer 112 or 212 may be formed specifically to maintain an operational level of conductivity or resistivity. As discussed earlier, charge trapping layer 112 or 212 is a continuous layer extending at least across neighboring NVM cells 1 and 2. Trapped charges (electrons and holes) in NVM cells 1 and 2 may migrate from its respective trapped area towards neighboring NVM cells due to the electric field induced by the trapped charges or the potential gradient between them. For example, trapped positive charges (holes) in NVM cell 2 may be attracted by and migrate towards NVM cell 1 via charge trapping layer 112 or 212 disposed above STI 304. As a result, losing charges in charge trapping layer 112 or 212 in NVM cells may result in a shift of threshold voltages (Vt) of NVM cells.

Figure 4:
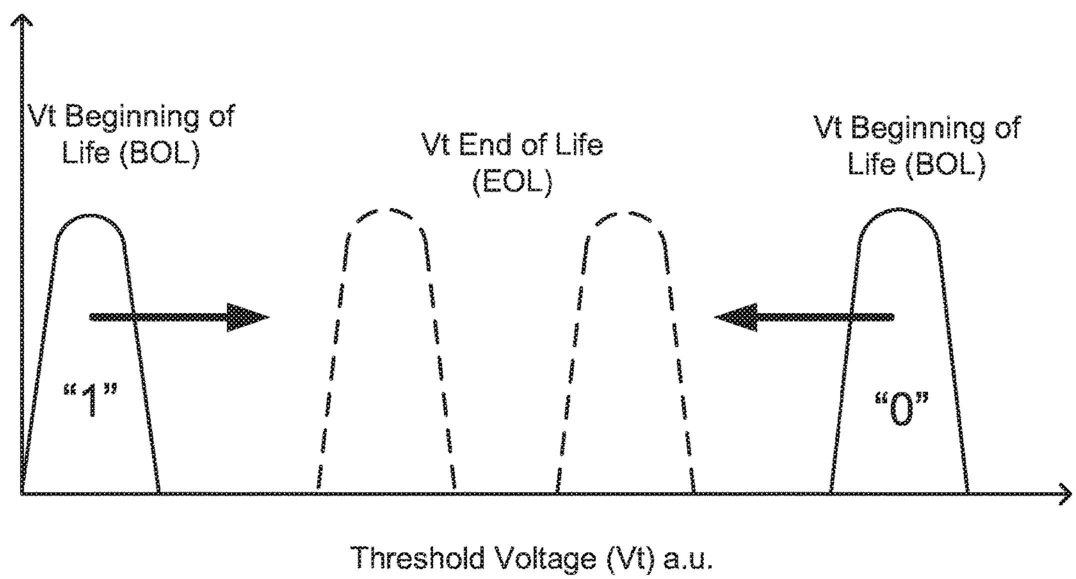
FIG. 4 is a representative chart illustrating effects on threshold voltage (Vt) of NVM cells in accordance with one embodiment of the subject matter.

FIG. 4 is a graph illustrating Vt shift of NVM cells in NVM arrays such as 1T memory array 100 and split gate memory array 200. As best shown in FIG. 4, Vt of erased cells shifts upward while Vt of programmed cells shifts downward gradually as time progresses. The gradual Vt shift of NVM cells may degrade the reliability of the NVM array over time. Eventually, Vt of programmed cells and erased cells may become too close in range, which may result in false reading of NVM cells.

Therefore, there may be necessary to minimize charges (electrons and holes) migration or loss amongst neighboring NVM cells that may share a common or continuous charge trapping layer in order to maintain reliability of NVM array, such as 1T memory array 100, split gate memory array 200, and 2T memory array 200'.

Figure 5:
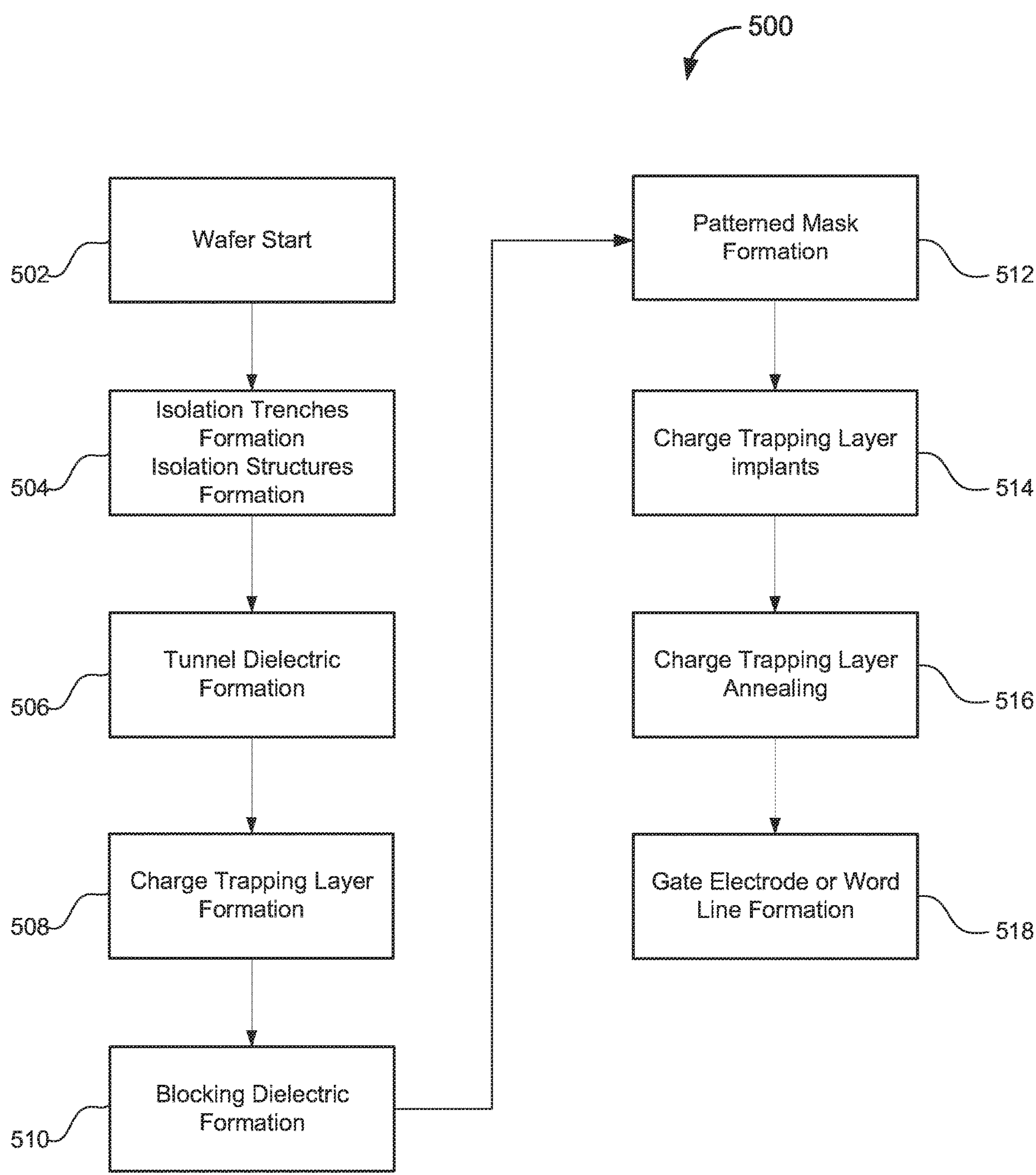
FIG. 5 is a flowchart illustrating an embodiment of a method of fabrication of an NVM device in accordance with one embodiment of the subject matter.

Embodiments depicted herein may be directed to fabrication processes that ensure that charge loss amongst neighboring NVM cells through the commonly shared charge trapping layer is minimized. FIG. 5 depicts a flowchart of fabricating NVM array, such as 1T memory array 100 and split gate memory array 200. FIGS. 6A-6J depicts a cross-sectional view along B-B' of 1T memory array 100 and split gate memory array 200 in FIGS. 1A and 1B.

Figure 6A:
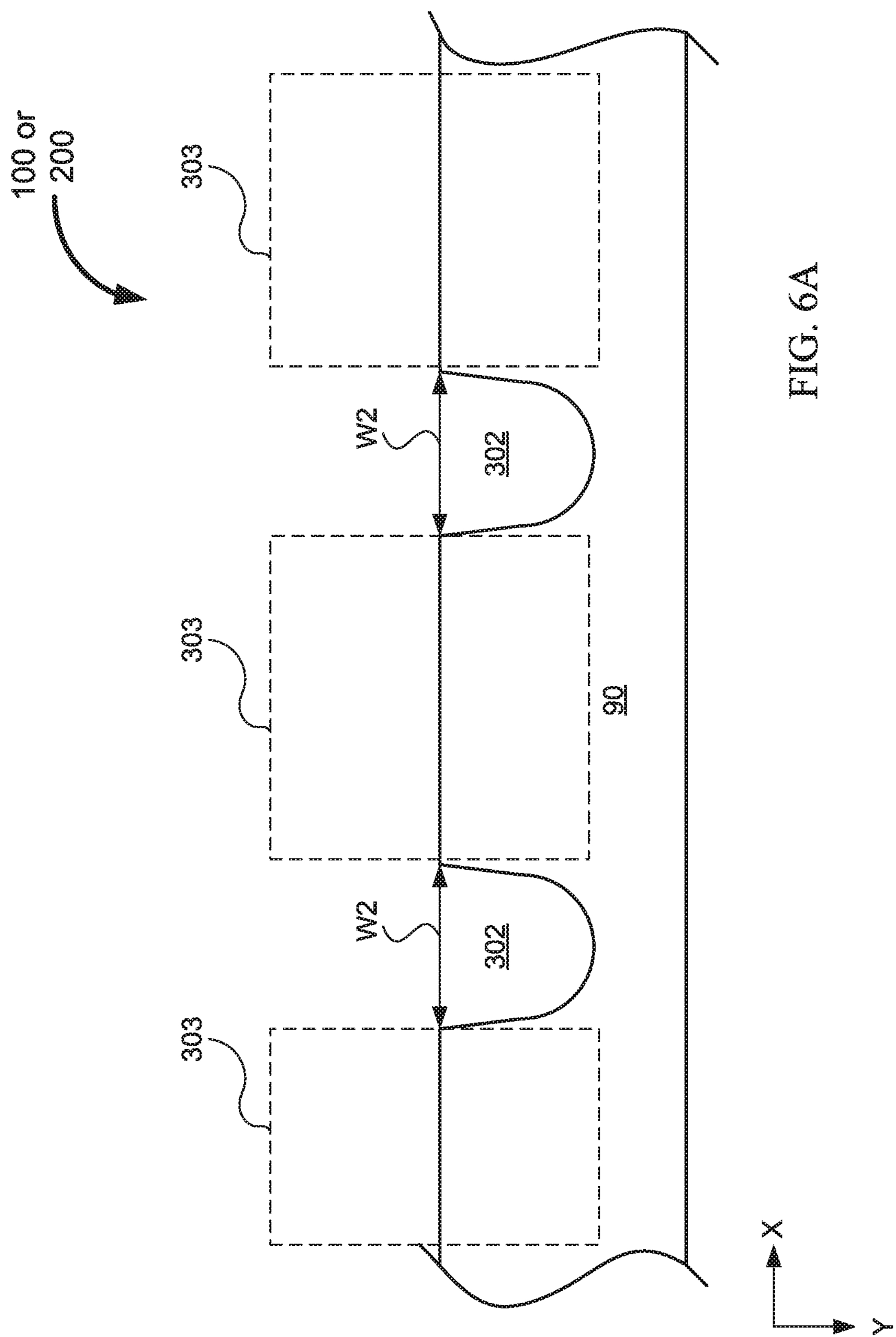
FIGS. 6A to 6J are representative diagrams illustrating a cross-sectional view of a portion of an NVM device during fabrication according to the method of FIG. 5.

Referring to FIGS. 5 and 6A, the process begins (in step 502) with formation of isolation trenches 302 between two neighboring 1T or split gate memory cells 102 or 201, in step 504. In one embodiment, isolation trenches 302 may be formed to extend lengthwise (direction z) to span across multiple rows of 1T or split gate memory arrays 100 and 200. In another embodiment, isolation trenches 302 may be contained within one row of 1T or split gate memory arrays 100 and 200. Isolation trenches 302 may have a variety of cross-sectional shapes and dimensions depending on apparatus requirements. In one embodiment, isolation trenches 302 may have a width of W2 (along direction x). In some embodiments, isolation trenches 302 in different parts of 1T or split gate memory arrays 100 and 200 may have approximate the same width or different widths. In one embodiment, isolation trenches 302 may isolate each of the neighboring 1T or split gate memory cells 102 or 201 of the same row, which may be formed in active regions or areas 303.

Substrate 90 may be a bulk wafer composed of any single crystal material suitable for semiconductor device fabrication, or may include a top epitaxial layer of a suitable material formed on a wafer. In one embodiment, suitable materials for substrate 90 include, but are not limited to, silicon, germanium, silicon-germanium or a Group III-V compound semiconductor material.

Figure 6B:
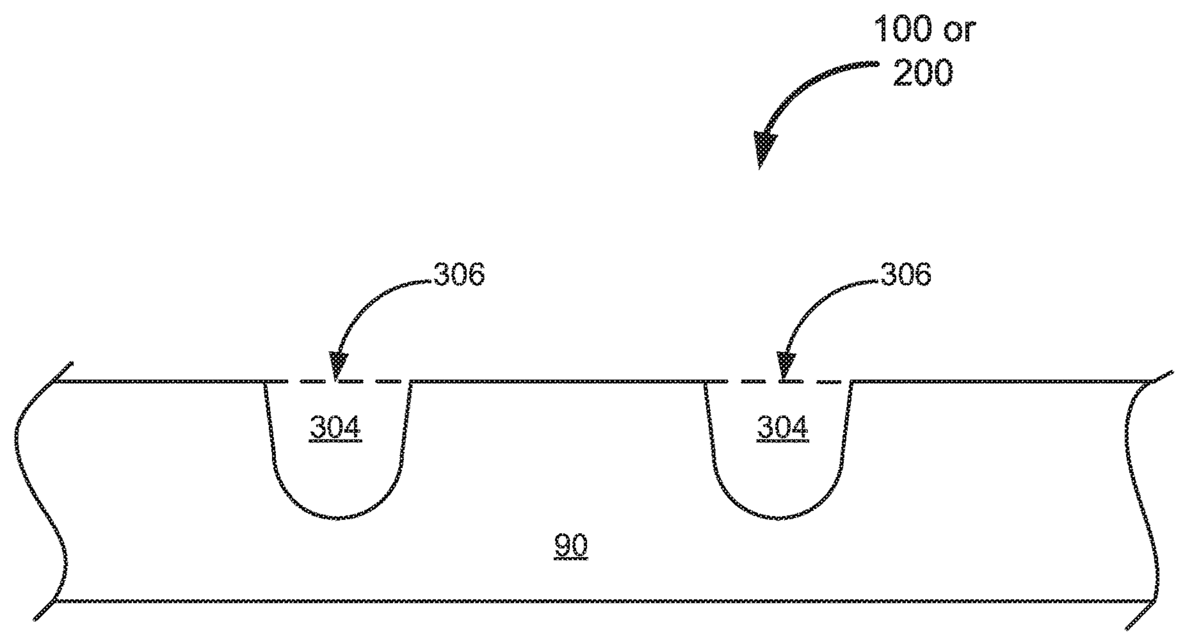
Figure 6C:
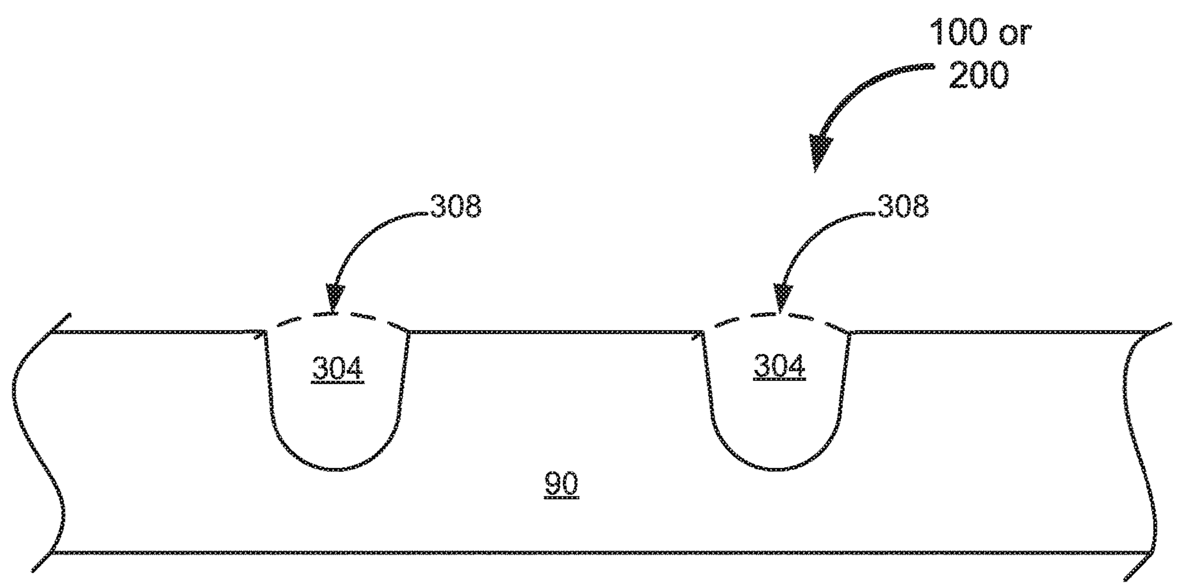

Next, referring to FIGS. 5 and 6B, dielectric material is filled within isolation trenches 302 to form a number of isolation structures or STIs 304 in substrate 90, in step 504. The isolation structures 304 isolate 1T or split gate memory cells 102 or 201 in the same row (direction x). In one embodiment, STI 304 may be filled or include a dielectric material, such as oxide or nitride, and may be formed by any conventional technique, including but not limited to shallow trench isolation (STI) or local oxidation of silicon (LOCOS). In one embodiment, referring to FIG. 6B, top surfaces of STI 304 are planarized or polished, for example, using a chemical mechanical polishing (CMP) process. The result of the CMP process is a common planar top surface 306. In one alternative embodiment, as illustrated in FIG. 6C, surfaces of STI 304 may not be planarized or polished. Top surfaces of STI 304 may be slightly dome-shaped 308. In another alternative embodiment, top surfaces of STI 304 may be slightly etched back in order to maintain a relatively flat surfaces 308. In one embodiment, surfaces of STI 304 may not be too severely dome-shaped, such that layers of material formed over them in subsequent processes may maintain relatively planar in shape.

Figure 6D:
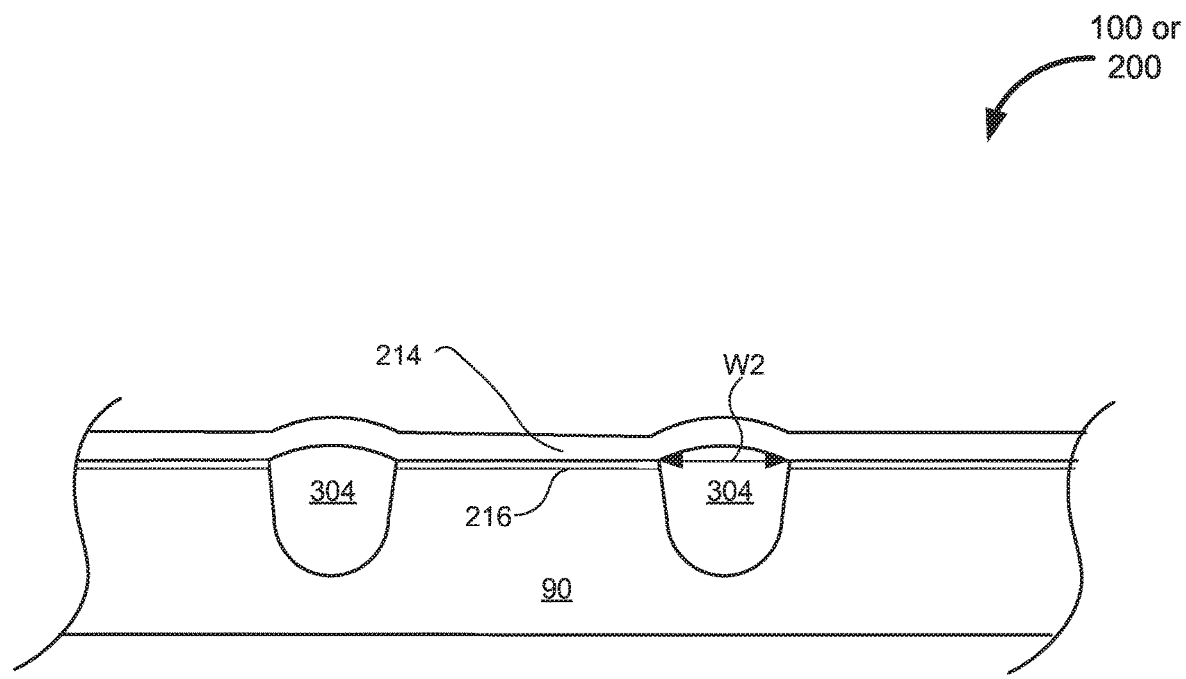

Next, referring to FIGS. 5 and 6D, channels 216 and tunnel dielectric layer 214 may be formed, in step 506. Optionally and in some embodiments, a pad oxide (not shown in these figures) may be formed over STI surfaces 308 and substrate 90. In one embodiment, pad oxide may be silicon dioxide ($SiO_2$) having a thickness of from about 10 nanometers (nm) to about 20 nm, and may be grown by a thermal oxidation process or in-situ steam generation (ISSG) process, or other oxidation processes known in the art. It will be the understanding that pad oxide may not be necessary, or formed in some embodiments. Next, a patterned mask (not shown) is formed on or overlying pad oxide or substrate 90, ions of an appropriate energy and concentration are implanted through a window or opening in the patterned mask to form channels 216 in 1T or split gate memory cells 102 or 201, via pad oxide if present. In various embodiment, 1T or split gate memory cells 102 or 201 may include n-channel transistors or p-channel transistors, depending on the doping ions. The patterned mask 504 may include a photoresist layer, or a hard mask formed, from a patterned nitride or silicon-nitride layer. In other embodiments, channel 216 may be formed later in the fabrication process.

Referring again to FIG. 6D, pad oxide if present, may be removed, for example in a wet clean process. Subsequently, tunnel dielectric layer 214 may be formed over STI surface 308 and/or channels 216 in substrate 90. In one embodiment, tunnel dielectric layer 214 may be relatively planar in shape and extend across multiple 1T or split gate memory cells 102 or 201 of the same row of 1T or split gate memory arrays 100 or 200. Tunnel dielectric 214 may be any material and have any thickness suitable to allow charge carriers to tunnel into an overlying charge-trapping layer under an applied gate bias while maintaining a suitable barrier to leakage when 1T memory cell 102 or memory transistor 202 is unbiased. In certain embodiments, tunnel dielectric 214 is silicon dioxide, silicon oxy-nitride, or a combination thereof and can be grown by a thermal oxidation process, using ISSG or radical oxidation.

Figure 6E:
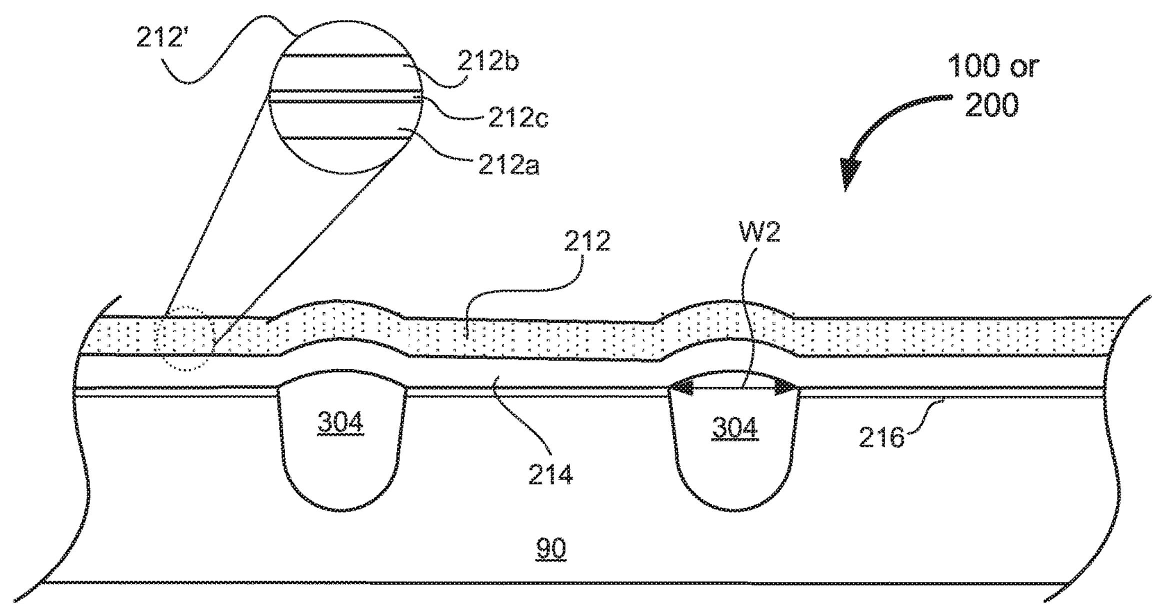

Next, referring to FIGS. 5 and 6E, charge trapping layer 212 may be formed overlying tunnel dielectric layer 214, in step 508. Similar to tunnel dielectric layer 214, charge trapping layer 212 may be a continuous layer, have a substantially planar profile or shape and extending across multiple 1T or split gate memory cells 102 or 201 of the same row of 1T or split gate memory arrays 100 or 200. Generally, as in the embodiment shown, charge trapping layer 212 may be a single-layer structure. In one embodiment, charge trapping layer may include silicon nitride (stoichiometric and/or non-stoichiometric) having a stoichiometric ratio of oxygen, nitrogen and silicon in the approximate concentration of 0%, 45-50%, and 50-55%, respectively. In one embodiment, concentration % may be calculated based on no. of atoms of each element. Charge trapping layer 212 may include a thickness of between about 6 nm and about 10 nm, or other operational thicknesses according to system requirements, and may be formed or deposited by a CVD process using a process gas including $DCS/NH_3$ and $N_2O/NH_3$ gas mixtures in ratios and at flow rates tailored to provide the aforementioned stoichiometry of oxygen, nitrogen, and silicon. In one embodiment, charge trapping layer 212 may be a silicon-rich, oxygen-lean nitride layer, such that it may trap charges effectively.

As illustrated in the exploded view in FIG. 6E, in an alternative embodiment, charge trapping layer 212' may be a multi-layer structure comprising multiple layers, which may include at least lower charge trapping layer 212*a* that is physically closer to tunnel dielectric layer 214, and an upper charge trapping layer 212*b*. In one embodiment, upper charge trapping layer 212*b* is disposed overlying lower charge trapping layer 212*a*, may be oxygen-lean relative to lower charge trapping layer 212*a*, and may comprise a majority of charge traps distributed in multi-layer charge-trapping layer 212'. In another embodiment, stoichiometry of upper and lower charge trapping layers 212*a* and 212*b* may be substantially the same.

In one embodiment, there may be a dielectric and/or oxide layer 212*c* formed between upper and lower charge trapping layers 212*a* and 212*b*, making the multi-layer charge trapping layer 212' an NON stack. The middle oxide layer 212*c* may substantially reduce the probability of charges that accumulate at the boundaries of top charge trapping layer 212*b* during programming from tunneling into lower charge-trapping layer 212*a*, resulting in lower leakage current than for the conventional memory devices. In one embodiment, the middle oxide layer 212*c* may be formed by oxidizing to a chosen depth of lower charge trapping layer 212*a* using thermal or radical oxidation, or other appropriate process steps.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher weight % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon oxynitride film is therefore more like silicon and the RI is increased toward the 3.5 RI of pure silicon. In one embodiment, whether charge trapping layer is a single-layer structure 212 or a multi-layer structure 212', it may include a stoichiometric ratio of oxygen, nitrogen and silicon in the approximate concentration of 0%, 45-50%, and 50-55%, respectively.

Figure 6F:
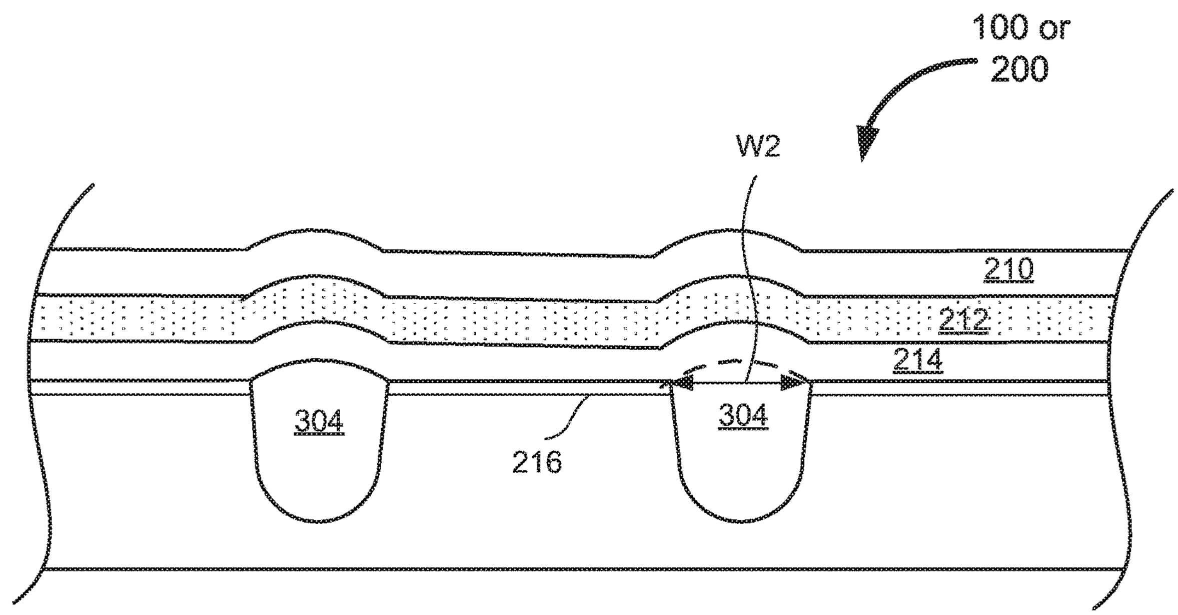

Next, referring to FIGS. 5 and 6F, blocking dielectric layer 210 may be formed overlying charge trapping layer 212, in step 510. In one embodiment, blocking dielectric layer 210 may be grown using an in situ steam generation (ISSG) process. At least a portion of charge trapping layer 212 is oxidized and consumed during the ISSG to form blocking dielectric layer 210. In one embodiment, the oxidation process may progress immediately to a separated step of a wet rapid and radical oxidation process, such as ISSG. In one embodiment, after the wet radical oxidation process such as ISSG, blocking dielectric layer 210 may have a thickness of from about 90 Å to about 120 Å. It will be understood that such a range is merely illustrative and is not meant to be limiting. In alternative embodiments, the step of wet rapid and radical oxidation may be substituted by processes such as chemical vapor deposition (CVD), or other radical oxidation processes. One of the benefits of growing blocking dielectric layer 210, using an oxidation process such as ISSG, is that the grown blocking dielectric layer 210 may have a more uniform structure and better quality oxide compared to blocking dielectric layer 210, which may be formed by deposition methods.

Figure 6G:
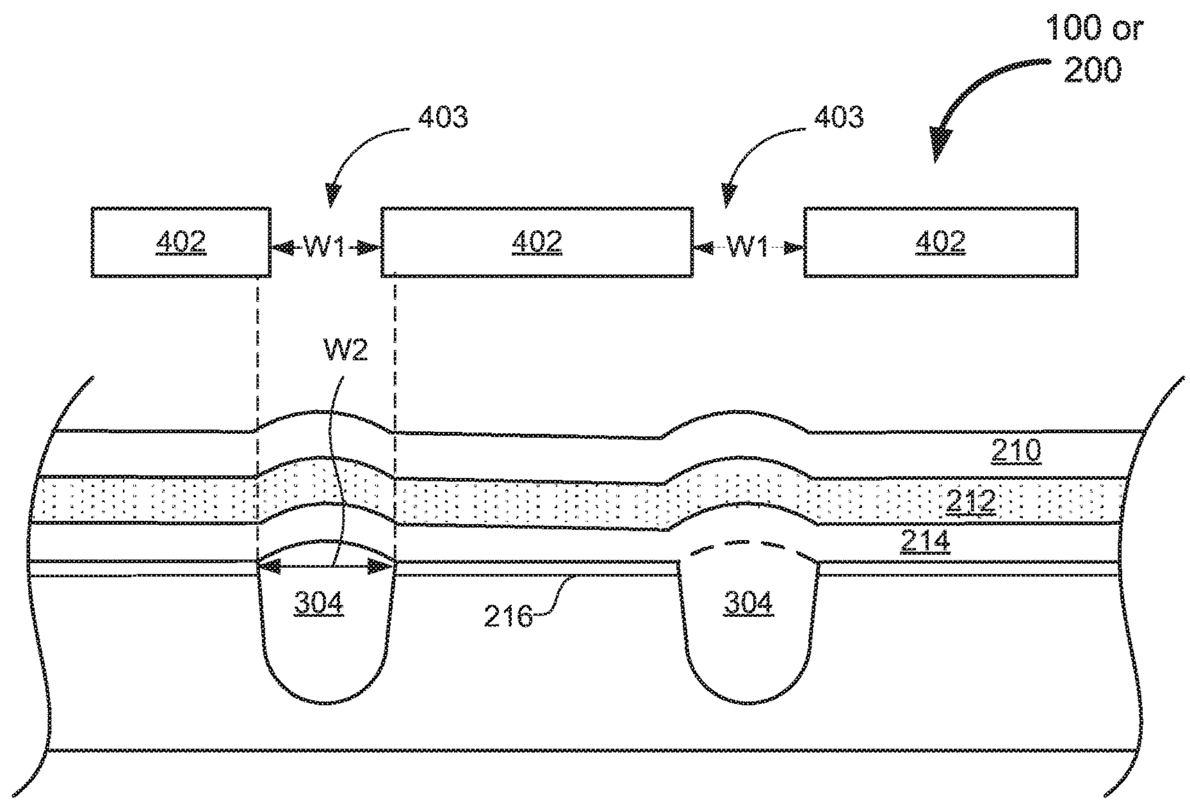

Next, referring to FIGS. 5 and 6G, a patterned mask may be formed on or overlying blocking dielectric layer 210, in step 512. In one embodiment, the patterned mask may be dedicated mask 402. Dedicated mask 402 may include a photoresist layer patterned using standard lithographic techniques, and includes at least one opening 403. In one embodiment, openings 403 may have a width of W1 and is aligned directly and vertically above STIs 304. As shown in FIG. 6G, each opening 403 may be aligned with and disposed substantially within a vertical projection of width W2 of each STI 304. In one embodiment, W2 is greater than or at least equal to W1 such that subsequent implants administered through openings 403 may not affect active areas in substrate 90 that are beyond width W2 of STIs 304. In another embodiment, dedicated mask 402 may be a hard mask.

Figure 6H:
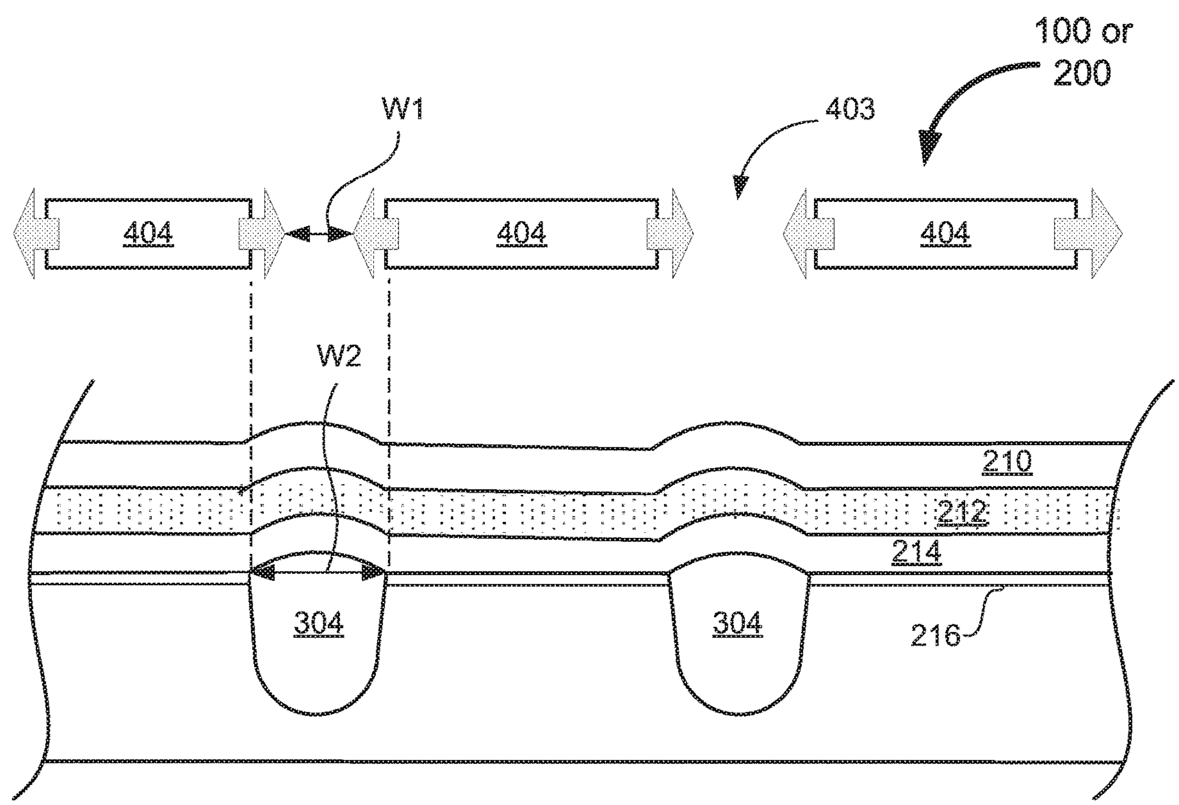
Figure 6I:
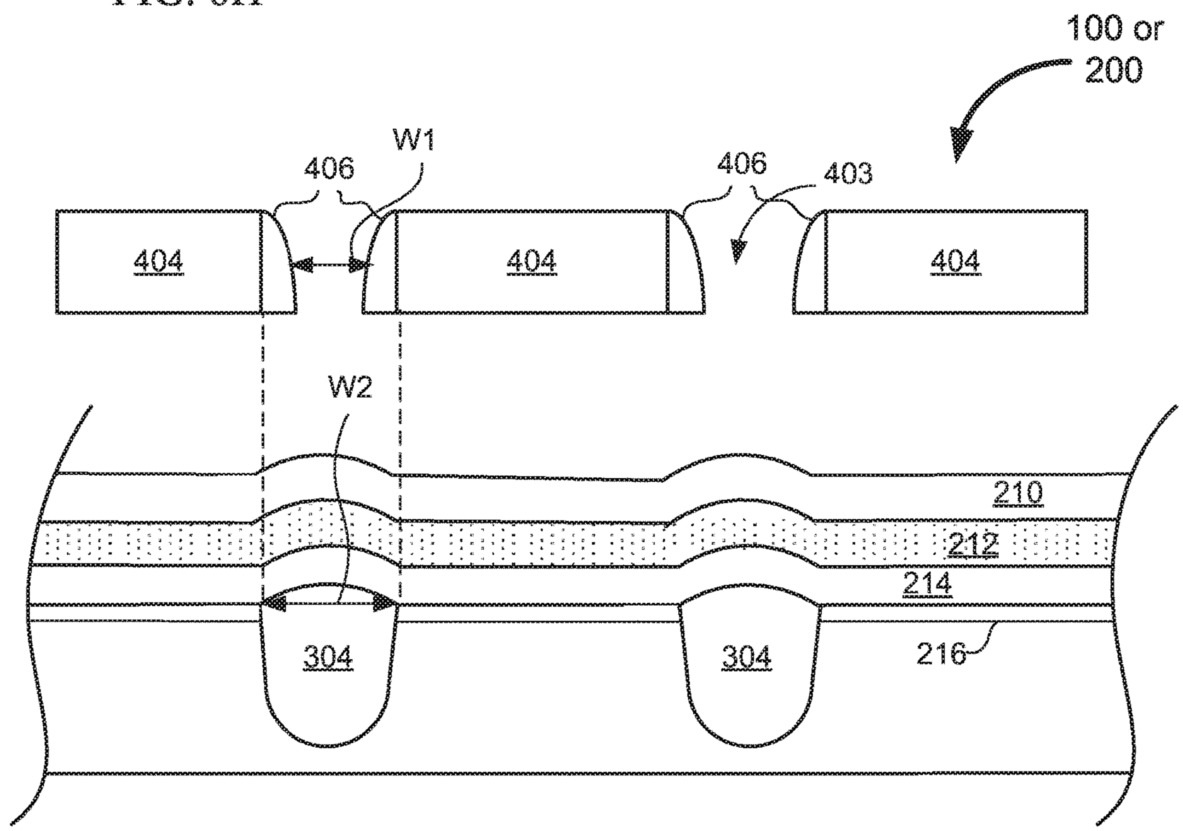

Referring to 6H, instead of forming dedicated mask 402, active area mask (not shown in this figure) or other existing masks may be used for the same purposes. For example, the existing mask for forming STIs 304 in step 504 may also be used. Active area mask may be a patterned mask used for forming source and/or drain regions, such as source 106 and/or drain 104 regions, or STIs 304 in FIG. 1A. In one embodiment, active area mask may have openings to expose source 106 and/or drain 104 regions such that appropriate dopants may be implanted in the areas. In one embodiment, openings of active area mask may stop at STIs 304. Referring to FIG. 6H, inversed active area mask 404 may be formed, using existing active area mask, on or overlying blocking dielectric layer 210. In one embodiment, inversed active area mask 404 may be formed by inversing the existing active area mask, such that STIs 304 may be exposed and source 106 and/or drain 104 regions and/or active area are covered and protected instead. Because inversed active area mask 404 may have approximately the same dimension of existing active area mask, openings 403 may have a width approximately the same as W2 of STIs 304. In one embodiment, inversed active area mask 404 may be a photoresist mask, and may be subjected to photoresist reflow process. Inversed active area mask 404 may undergo this thermal expansion process such that openings 403 may be narrowed down from approximately W2 (same as STIs 304) to W1. In one embodiment, W2 is greater than or at least equal to W1 such that subsequent implants administered through openings 403 may not affect areas in substrate 90 that are beyond width W2 of STIs 304. The thermal photoresist reflow process may be any commonly employed in the art for adjusting dimensions of photoresist mask.

Referring to 6I, in another embodiment, inversed active area mask 404 may be formed, using existing active area mask (not shown in this figure) or other appropriate existing masks, on or overlying blocking dielectric layer 210. In one embodiment, inversed active area mask 404 may be formed by inversing the existing active area mask, such that STIs 304 may be exposed and source 106 and/or drain 104 regions or active areas are covered and protected instead. In one embodiment, alternatively or additionally to the aforementioned photoresist reflow process as best shown in FIG. 6H, spacers 406 are formed in each opening 403 to reduce the width of opening 403 from approximately W2 to W1. In one embodiment, W2 is greater than or at least equal to W1 such that subsequent implants administered through openings 403 may not affect active areas in substrate 90 that are beyond width W2 of STIs 304. Spacers 406 may be made out of organic or inorganic materials, and may be disposed on at least one side of openings 403 of inversed active area mask 404.

Figure 6J:
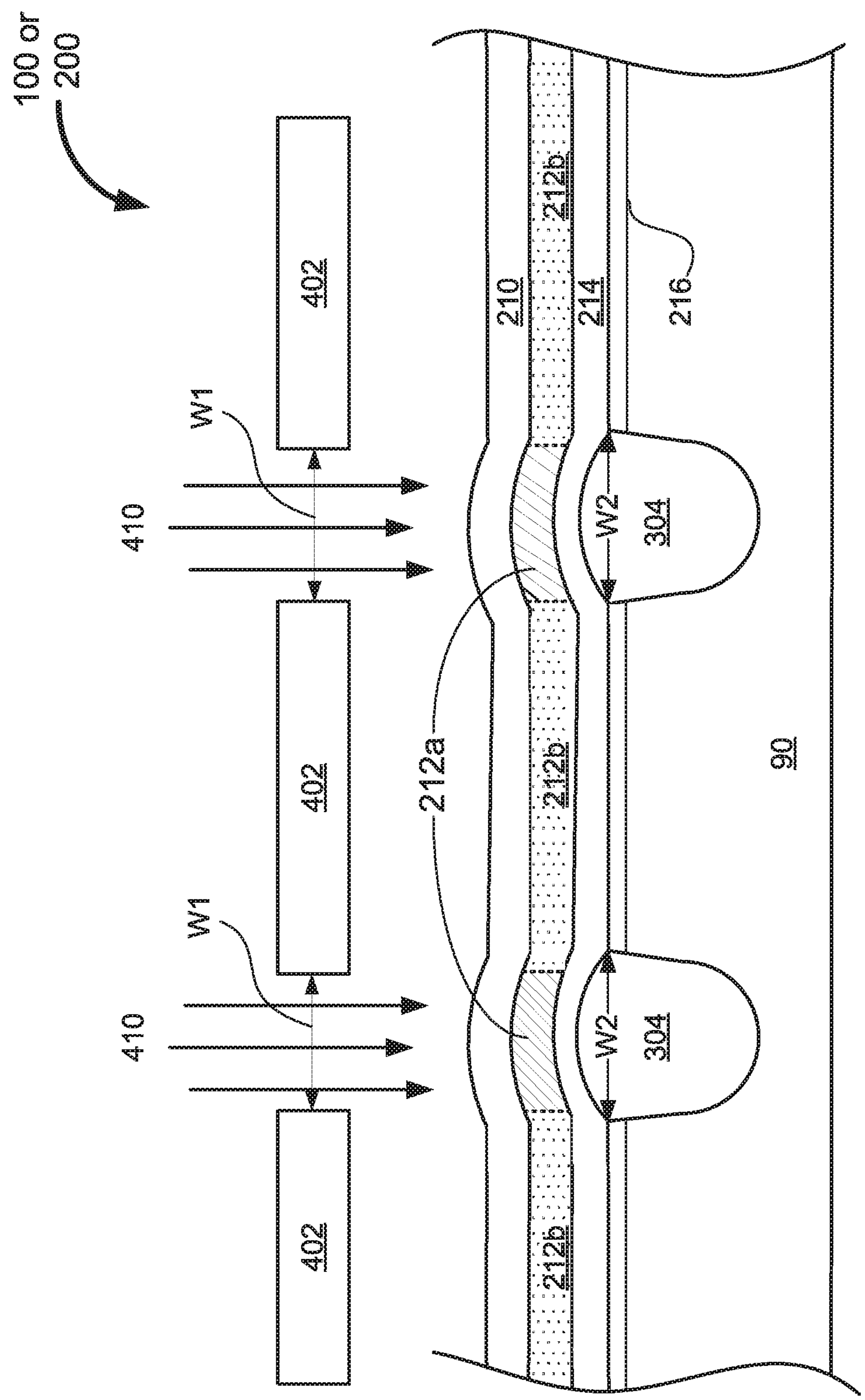

Next, referring to FIGS. 5 and 6J, oxygen and/or nitrogen doping in charge trapping layer 212 may be performed, in step 514. Appropriate ion/atom species 410 are implanted on exposed areas in charge trapping layer 212 through openings 403. In one embodiment, oxygen ions $O^+$ or atoms at appropriate energy and concentration may be implanted on charge trapping layer 212 through opening 403 of dedicated photoresist mask 402. It will be the understanding that dedicated mask 402 may be replaced by inversed active area mask 404 in FIG. 6H (after thermal photoresist reflow) or in FIG. 6I (with spacers 406). In one embodiment, nitrogen ions $N^+$ or atoms at appropriate energy and concentration may also be implanted on charge trapping layer 212 through opening 403 of dedicated mask 402. It may be imperative to control doping area within the vertical projection of W2 of STI 304 such that oxygen and/or nitrogen ions/atoms are not implanted in portions of charge trapping layer 212 that are within an NVM cell such as 1T memory cell 102 or split gate memory cell 201, or directly above channels 116 or 216. The oxygen and nitrogen implantation may adversely affect the charge trapping ability of NVM cells, which may subsequently affect the program/erase speed, retention, and overall performance of NVM cells. It will be the understanding that implant energy and concentration of the oxygen and nitrogen may be adjusted according to system requirements and ordinary skill in the art.

The oxygen and nitrogen implantation may be carried out simultaneously or separately. In some embodiments, only one of the oxygen implant and nitrogen implant may be applied to charge trapping layer 212. After the oxygen and/or nitrogen implantation, stoichiometry of portions of charge trapping layer 212 that are above STIs 304, may be altered, and become doped charge trapping portions 212*a*. In one embodiment, stoichiometry of portions of charge trapping layer that are besides STIs 304 or in the active regions may not be affected, and remain undoped charged trapping portions 212*b*. As best shown in FIG. 6J, doped portions 212*a* and undoped portions 212*b* formed integrally the continuous structure of charge trapping layer 212. In one embodiment, the oxygen implantation may convert a portion of the nitride in charge trapping layer 212 to oxide or oxygen-rich oxynitride at or around doped portions 212*a*, raising the oxygen concentration of doped portions 212*a* as a result. The nitrogen implantation may convert a portion of the nitride in charge trapping layer 212 to nitrogen-rich nitride or oxynitride at or around doped portions 212*a*, raising the nitrogen concentration as a result. An example of stoichiometric ratios of undoped charge trapping portions 212*b* and doped charge trapping portions 212*a* are summarized in the following Table 1. It will be the understanding that, the following concentration ranges of silicon, nitrogen, and oxygen in the charge trapping layer 212 are for illustrative purposes only, and not for limitations.

TABLE 1

Approximate concentration range of silicon, nitrogen, and oxygen in charge trapping layer before and after implantation.

| Concentration (%) | % of Si | % of N | % of O |
|---|---|---|---|
| Undoped Charge Trapping Layer | 50-55% | 45-50% | 0% |
| Doped with Nitrogen only | 43-50% | 50-57% | 0% |
| Doped with Oxygen only | 40-50% | 30-45% | 5-20% |
| Doped with both Nitrogen and Oxygen | 30-45% | 40-50% | 5-20% |

In one embodiment, the main purpose of oxygen and/or nitrogen implant may be to reduce electrical conductivity or increase resistivity of portions of charge trapping layer 212*a* that are directly above STIs 304 (the charge migration path between two NVM cells as best shown in FIG. 3). In one embodiment, after the oxygen and/or nitrogen implantation, the resistivity of the doped portions 212*a* may increase. The increase in resistivity of doped regions 212*a*, that are disposed directly above STIs 304 (or in the STI regions), may minimize charge migration or loss from undoped regions 212*b* of charge trapping layer 212 from one NVM cell to the others. In one embodiment, trapped charges (electrons and holes) may be less likely to migrate, as previously shown in FIG. 3, from one NVM cell to the others, such as its neighboring NVM cells, if the resistivity of the doped portions 212*a* of charge trapping layer 212 is increased.

In some embodiment, the steps 512 and/or 514 of nitrogen and/or oxygen implantation of charge trapping layer 212 may be implemented before blocking dielectric layer 210 is formed in step 510. The oxygen and/or nitrogen implant may be applied directly on charge trapping layer 212, rather than through blocking dielectric layer 210 (not shown in figures).

Next, referring to FIG. 5, post implant anneal is performed, in step 516. In one embodiment, the anneal process may be a furnace process or rapid thermal annealing, and may be performed at an appropriate temperature range that is known in the art, or may be any commonly employed process in the art to activate the oxygen and/or nitrogen implant in doped portions 212*a* of charge trapping layer 212.

Figure 6K:
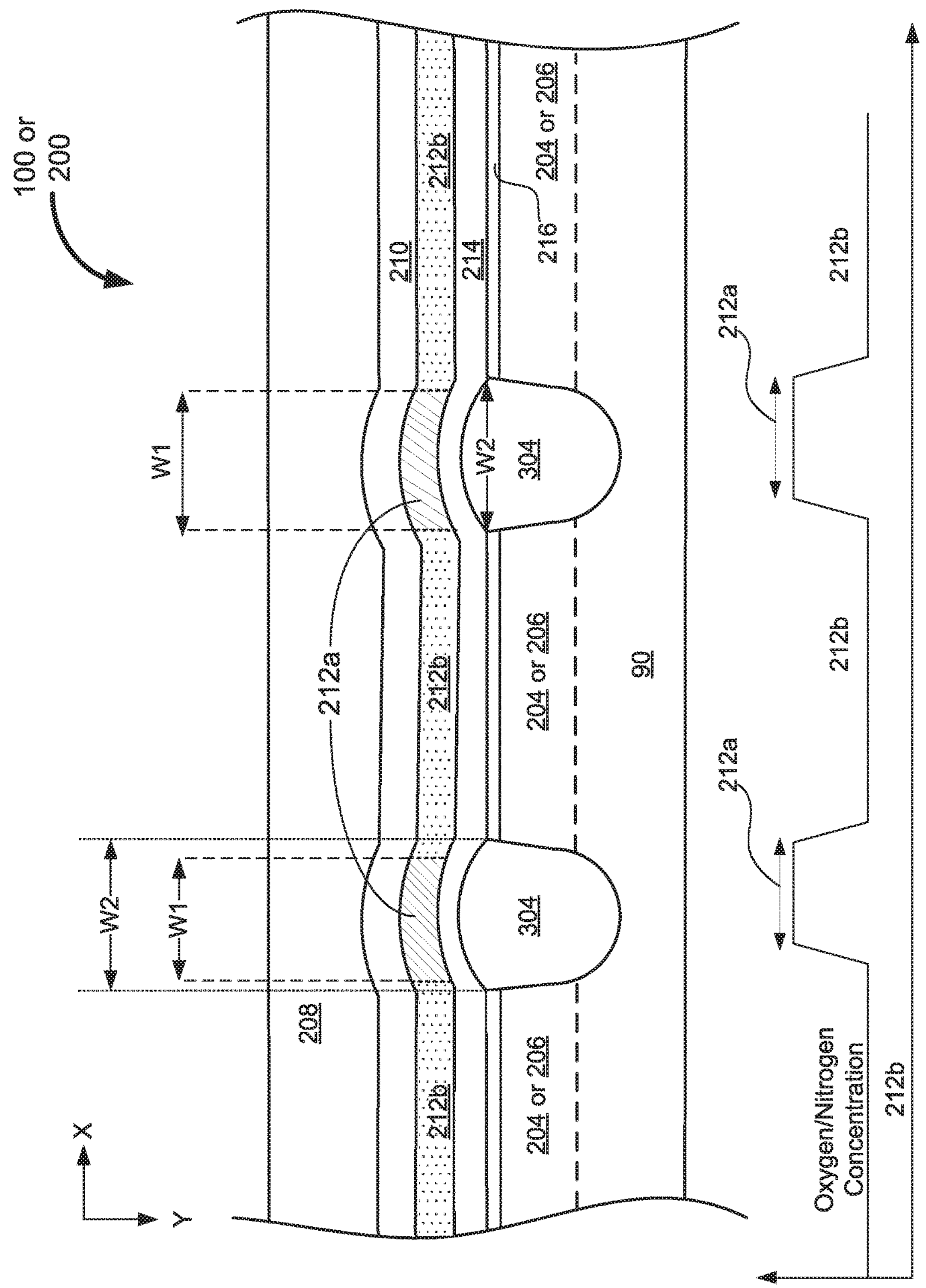
FIG. 6K is a representative diagram illustrating a cross-sectional view of a portion of a finished NVM device fabricated according to the method of FIGS. 5 and 6A-6J.

Next, referring to FIGS. 5 and 6K, memory gate electrode layer may be formed overlying blocking dielectric layer, in step 518. In one embodiment, memory gate electrode layer 214 may be relatively planar in shape and extending across multiple 1T or split gate memory cells 102 or 201 of the same row (direction x) of 1T or split gate memory arrays 100 or 200. Gate electrode layer 208 may be composed of any conducting or semiconducting material suitable for accommodating a biasing of 1T memory cell 102 or memory transistor 202 of split cell memory cell 201. In one embodiment, memory gate electrode layer 208 may be formed by physical vapor deposition and composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, memory gate electrode layer 208 may be formed by a CVD process and composed of a single doped polysilicon layer, which may then be patterned to form gate electrode layer 208. In one embodiment, gate electrode layer 208 may be configured to be at least a part of the word line connecting control gates of 1T memory cells 102 or memory transistors 202 of split cell memory cells 201 in the same row.

A cross-sectional view along B-B' in FIGS. 1A and 1B featuring an embodiment of a portion of finished 1T or split gate memory array 100 or 200 is illustrated in FIG. 6K. In one embodiment, source or drain regions 206 or 204 of each memory cell of the same row (along direction x) may be isolated by STIs 304. STI 304 may have a width of W2. In one embodiment, tunnel dielectric layer 214, charge trapping layer 212, blocking dielectric layer 210, and memory gate electrode layer 208 may be subsequently formed over STIs 304 and channels 216 in substrate 90. As discussed earlier, tunnel dielectric layer 214, charge trapping layer 212, blocking dielectric layer 210, and memory gate electrode layer 208 may be continuous layers spanning across multiple 1T or split gate memory cells 102 or 201 of the same row. As best shown in FIG. 6K, charge trapping layer 212 may be further divided into doped portions 212*a* and undoped portions 212*b*. Doped and undoped portions 212*a* and 212*b* of charge trapping layer 212 may be formed by oxygen and/or nitrogen implantation at least disclosed in FIG. 6J. As a result, concentration of oxygen and/or nitrogen in doped portions 212*a* may be higher than undoped portions 212*b*. In an alternative embodiment, doped and undoped portions 212*a* and 212*b* of charge trapping layer 212 may be formed by other processes known in the art, such that concentration of oxygen and/or nitrogen in doped portions 212*a* may be higher than undoped portions 212*b* or resistivity of doped portions 212*a* is increased compared to undoped portions 212*b*. In one embodiment, doped portions 212*a* may have width W1 and may be disposed directly above STIs 304. Doped portions 212*a* may be disposed substantially within the vertical projection of width W2 of STIs 304, and W2 may be at least equal to or greater than W1. In one embodiment, stoichiometry of doped and undoped portions 212*a* and 212*b* are different. For example, undoped portions 212*b* may have Si—50-55%, O—0%, N—45-50%, and doped portions 212*a* may have Si—43-50%, O—0%, N—50-57% (doped with nitrogen only), Si—40-50%, O—5-20%, N—30-45% (doped with oxygen only), and Si—30-45%, O—5-20%, N—40-50% (doped with both oxygen and nitrogen). The electrical resistivity of doped portions 212*a* may become higher than undoped portions 212*b*, such that charge migration among neighboring 1T or split gate memory cells 102 or 201 may be minimized. In one embodiment, multiple doped and undoped portions 212*a* and 212*b* may form integrally the entire continuous charge trapping layer 212 of the same row.

As best shown in FIG. 6K, oxygen and/or nitrogen concentration profile of charge trapping layer 212, along B-B' of FIGS. 1A and 1B, increases at or around doped portions 212*a*. In one embodiment, oxygen and/or nitrogen concentration at or around undoped portions 212*b* may maintain at an operable level, such that charges (electrons or holes) are effectively trapped within undoped portions 212*b* of charge trapping layer 212.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:

forming an isolation structure in a substrate between a first substrate location for a first non-volatile memory (NVM) cell and a second substrate location for a second NVM cell;

forming a common charge trapping layer as a continuous structure over the substrate, wherein a first portion of the common charge trapping layer is disposed directly over the isolation structure, and wherein second portions of the common charge trapping layer are disposed directly over the first substrate location and the second substrate location;

performing oxygen doping of the first portion of the common charge trapping layer, wherein after the oxygen doping is performed the first portion of the common charge trapping layer includes a higher oxygen concentration than the second portions of the common charge trapping layer;

performing nitrogen doping of the first portion of the common charge trapping layer, wherein after the nitrogen doping is performed the first portion of the common charge trapping layer includes a higher nitrogen concentration than the second portions of the common charge trapping layer; and forming the first NVM cell over the first substrate location and the second NVM cell over the second substrate location, wherein the first NVM cell and the second NVM cell include the second portions of the common charge trapping layer.

2. The method of claim 1, wherein forming the isolation structure comprises:

forming an isolation trench in the substrate between the first substrate location and the second substrate location; and filling the isolation trench with a dielectric material.

3. The method of claim 1, wherein the method comprises forming a tunnel dielectric layer as a continuous layer over the first substrate location, the isolation structure, and the second substrate location, and wherein the common charge trapping layer is formed over the tunnel dielectric layer.

4. The method of claim 1, wherein the method comprises:

forming a blocking dielectric layer over the common charge trapping layer; and forming a patterned mask over the blocking dielectric layer, wherein the patterned mask includes an opening aligned directly over the first portion of the common charge trapping layer;

wherein the oxygen doping and the nitrogen doping of the first portion of the common charge trapping layer are performed through the opening of the patterned mask.

5. The method of claim 4, wherein the patterned mask is one of an active area mask and an inversed active area mask.

6. The method of claim 4, wherein forming the patterned mask further comprises forming spacers in the opening to reduce the width of the opening.

7. The method of claim 4, wherein forming the first NVM cell and the second NVM cell comprises depositing a gate electrode layer over the blocking dielectric layer.

8. The method of claim 1, wherein after the oxygen doping and the nitrogen doping are performed, the first portion of the common charge trapping layer includes a first stoichiometry of silicon in an approximate concentration range of 30-45%, oxygen in an approximate concentration range of 5-20%, and nitrogen in an approximate concentration range of 40-50%.

9. The method of claim 8, wherein after the oxygen doping and the nitrogen doping are performed, the second portions of the common charge trapping layer include a second stoichiometry of silicon in an approximate concentration range of 50-55%, oxygen in an approximate concentration of 0%, and nitrogen in an approximate concentration range of 45-50%.

10. The method of claim 1, where the method comprises performing post-implant annealing to activate the oxygen doping and the nitrogen doping in the first portion of the common charge trapping layer.

* * * * *